US012793772B2

(12) United States Patent
Huang et al.

(10) Patent No.: US 12,793,772 B2
(45) Date of Patent: Nov. 10, 2026

(54) MEMORY DEVICE AND PROGRAM OPERATION THEREOF

(71) Applicant: YANGTZE MEMORY TECHNOLOGIES CO., LTD., Wuhan (CN)

(72) Inventors: Ying Huang, Wuhan (CN); Hongtao Liu, Wuhan (CN); Pengyu Xu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 328 days.

(21) Appl. No.: 18/413,615

(22) Filed: Jan. 16, 2024

(65) Prior Publication Data

US 2025/0218520 A1 Jul. 3, 2025

Related U.S. Application Data

(63) Continuation of application No. PCT/CN2023/142564, filed on Dec. 28, 2023.

(51) Int. Cl.

| | |
|---|---|
| *G11C 11/56* | (2006.01) |
| *G11C 16/04* | (2006.01) |
| *G11C 16/10* | (2006.01) |
| *G11C 16/24* | (2006.01) |
| *G11C 16/34* | (2006.01) |

(52) U.S. Cl.

CPC ...... *G11C 11/5628* (2013.01); *G11C 16/0483* (2013.01); *G11C 16/102* (2013.01); *G11C 16/24* (2013.01); *G11C 16/3459* (2013.01)

(58) Field of Classification Search

CPC ... G11C 16/3459; G11C 16/102; G11C 16/24; G11C 2211/5621; G11C 11/5628; G11C 16/0483

See application file for complete search history.

(56) References Cited

U.S. PATENT DOCUMENTS

| | | | | |
|---|---|---|---|---|
| 2008/0253181 A1* | 10/2008 | Edahiro | G11C 16/3418 | 365/185.17 |
| 2010/0061151 A1* | 3/2010 | Miwa | G11C 11/5628 | 365/185.17 |
| 2015/0146484 A1 | 5/2015 | Lee et al. | | |
| 2020/0143891 A1 | 5/2020 | Takeyama | | |
| 2022/0215873 A1 | 7/2022 | Islam et al. | | |
| 2022/0415417 A1 | 12/2022 | Wang et al. | | |

OTHER PUBLICATIONS

International Search Report issued in corresponding International Application No. PCT/CN2023/142564, mailed on Jun. 11, 2024, 3 pages.

Communication pursuant to Article 94(3) EPC issued in corresponding European Application No. 23858405.6, mailed on Jun. 12, 2026, 9 pages.

* cited by examiner

*Primary Examiner* — Jay W. Radke

(74) *Attorney, Agent, or Firm* — BAYES PLLC

(57) ABSTRACT

In certain aspects, a memory device includes memory cells and a peripheral circuit coupled to the memory cells. The peripheral circuit is configured to perform a first program pass on the memory cells by skipping a programming on a first subset of the memory cells corresponding to a set of skipped program states. A target program state of each memory cell in the first subset is one of the set of skipped program states. The peripheral circuit is further configured to perform a second program pass on the memory cells.

20 Claims, 21 Drawing Sheets

1200

100

500

TABLE 1

| | Start P(1) Verify | | Start P(2) Verify | | Start P(3) Verify | | Start P(4) Verify | | Start P(5) Verify | |
|---|---|---|---|---|---|---|---|---|---|---|
| **Program pulse** | Pulse 1 | Pulse 2 | Pulse 3 | Pulse 4 | Pulse 5 | Pulse 6 | Pulse 7 | Pulse 8 | Pulse 9 | Pulse 10 |
| **Program cells** | P(1)~P(7) | P(1)~P(7) | P(1)~P(7) | P(1)~P(7) | P(1)~P(7) | P(2)~P(7) | P(2)~P(7) | P(3)~P(7) | P(3)~P(7) | P(4)~P(7) |
| **Verify Voltage (Verify level)** | P(1) | P(1) | P(1)/P(2) | P(1)/P(2) | P(1)/P(2)/ P(3) | P(2)/P(3) | P(2)/P(3)/ P(4) | P(3)/P(4) | P(3)/P(4)/ P(5) | P(4)/P(5) |

| | Start P(6) Verify | | Start P(7) Verify | | | | |
|---|---|---|---|---|---|---|---|
| **Program pulse** | Pulse 11 | Pulse 12 | Pulse 13 | Pulse 14 | Pulse 15 | Pulse 16 | Pulse 17 |
| **Program cells** | P(4)~P(7) | P(5)~P(7) | P(5)~P(7) | P(6)~P(7) | P(6)~P(7) | P(7) | P(7) |
| **Verify Voltage (Verify level)** | P(4)/P(5)/ P(6) | P(5)/P(6) | P(5)/P(6)/ P(7) | P(6)/P(7) | P(6)/P(7) | P(7) | P(7) |

FIG. 6E

TABLE 2

| | Start P(1) Verify | | Start P(2) Verify | | Start P(3) Verify | | Start P(4) Verify | | Start P(5) Verify | |
|---|---|---|---|---|---|---|---|---|---|---|
| **Program pulse** | Pulse 1 | Pulse 2 | Pulse 3 | Pulse 4 | Pulse 5 | Pulse 6 | Pulse 7 | Pulse 8 | Pulse 9 | Pulse 10 |
| **Program cells** | | | | | P(3)~P(7) | P(3)~P(7) | P(3)~P(7) | P(3)~P(7) | P(3)~P(7) | P(4)~P(7) |
| **Verify Voltage (Verify level)** | | | | | P(3) | P(3) | P(3)/P(4) | P(3)/P(4) | P(3)/P(4)/P(5) | P(4)/P(5) |

| | Start P(6) Verify | | Start P(7) Verify | | | | |
|---|---|---|---|---|---|---|---|
| **Program pulse** | Pulse 11 | Pulse 12 | Pulse 13 | Pulse 14 | Pulse 15 | Pulse 16 | Pulse 17 |
| **Program cells** | P(4)~P(7) | P(5)~P(7) | P(5)~P(7) | P(6)~P(7) | P(6)~P(7) | P(7) | P(7) |
| **Verify Voltage (Verify level)** | P(4)/P(5)/P(6) | P(5)/P(6) | P(5)/P(6)/P(7) | P(6)/P(7) | P(6)/P(7) | P(7) | P(7) |

FIG. 7E

TABLE 3

| | Start P(1) Verify | | Start P(2) Verify | | Start P(3) Verify | | Start P(4) Verify | | Start P(5) Verify | |
|---|---|---|---|---|---|---|---|---|---|---|
| **Program pulse** | Pulse 1 | Pulse 2 | Pulse 3 | Pulse 4 | Pulse 5 | Pulse 6 | Pulse 7 | Pulse 8 | Pulse 9 | Pulse 10 |
| **Program cells** | P(1), P(2), P(5)~P(7) | P(1), P(2), P(5)~P(7) | P(1), P(2), P(5)~P(7) | P(1), P(2), P(5)~P(7) | | | | | P(5)~P(7) | P(5)~P(7) |
| **Verify Voltage (Verify level)** | P(1) | P(1) | P(1)/P(2) | P(1)/P(2) | | | | | P(2)/P(5) | P(5) |

| | Start P(6) Verify | | Start P(7) Verify | | | | |
|---|---|---|---|---|---|---|---|
| **Program pulse** | Pulse 11 | Pulse 12 | Pulse 13 | Pulse 14 | Pulse 15 | Pulse 16 | Pulse 17 |
| **Program cells** | P(5)~P(7) | P(5)~P(7) | P(5)~P(7) | P(6)~P(7) | P(6)~P(7) | P(7) | P(7) |
| **Verify Voltage (Verify level)** | P(5)/P(6) | P(5)/P(6) | P(5)/P(6)/P(7) | P(6)/P(7) | P(6)/P(7) | P(7) | P(7) |

FIG. 8D

TABLE 4

| | Start P(1) Verify | | Start P(2) Verify | | Start P(3) Verify | | Start P(4) Verify | | Start P(5) Verify | |
|---|---|---|---|---|---|---|---|---|---|---|
| **Program pulse** | Pulse 1 | Pulse 2 | Pulse 3 | Pulse 4 | Pulse 5 | Pulse 6 | Pulse 7 | Pulse 8 | Pulse 9 | Pulse 10 |
| **Program cells** | P(1)~P(5) | P(1)~P(5) | P(1)~P(5) | P(1)~P(5) | P(1)~P(5) | P(2)~P(5) | P(2)~P(5) | P(3)~P(5) | P(3)~P(5) | P(4)~P(5) |
| **Verify Voltage (Verify level)** | P(1) | P(1) | P(1)/P(2) | P(1)/P(2) | P(1)/P(2)/P(3) | P(2)/P(3) | P(2)/P(3)/P(4) | P(3)/P(4) | P(3)/P(4)/P(5) | P(4)/P(5) |

| | Start P(6) Verify | | Start P(7) Verify | | | | |
|---|---|---|---|---|---|---|---|
| **Program pulse** | Pulse 11 | Pulse 12 | Pulse 13 | Pulse 14 | Pulse 15 | Pulse 16 | Pulse 17 |
| **Program cells** | P(4)~P(5) | P(5) | P(5) | | | | |
| **Verify Voltage (Verify level)** | P(4)/P(5) | P(5) | P(5) | | | | |

FIG. 9E

MEMORY DEVICE AND PROGRAM OPERATION THEREOF

CROSS-REFERENCE TO RELATED APPLICATIONS

This application is a continuation of International Application No. PCT/CN2023/142564, filed on Dec. 28, 2023, entitled "MEMORY DEVICE AND PROGRAM OPERATION THEREOF," which is incorporated herein by reference in its entirety.

BACKGROUND

The present disclosure relates to memory devices and operation methods thereof.

Non-volatile storage devices such as solid-state drives (SSDs), non-volatile memory express (NVMe), embedded multimedia cards (eMMCs), and universal flash storage (UFS) devices, etc., have gained significant popularity in recent years due to their numerous advantages over traditional hard disk drives (HDDs), such as faster read and write speed, durability and reliability, reduced power consumption, silent operation, and smaller form factors. For example, non-volatile storage devices such as SSDs may use NAND Flash memory for non-volatile storage. Various operations can be performed by NAND Flash memory, such as read, program (write), and erase. For NAND Flash memory, an erase operation can be performed at the block level, and a program operation or a read operation can be performed at the page level.

SUMMARY

In one aspect, a method of operating a memory device that includes memory cells is disclosed. The method includes performing a first program pass on the memory cells by skipping a programming on a first subset of the memory cells corresponding to a set of skipped program states. A target program state of each memory cell in the first subset is one of the set of skipped program states. The method further includes performing a second program pass on the memory cells.

In some implementations, skipping the programming on the first subset of the memory cells includes applying an inhibit voltage to a set of bit lines corresponding to the first subset of the memory cells to inhibit the programming on the first subset of the memory cells in the first program pass.

In some implementations, the memory cells are associated with an erased state and a plurality of program states. The set of skipped program states includes two or more continuous program states.

In some implementations, performing the first program pass on the memory cells further includes programming, in the first program pass, a second subset of the memory cells corresponding to a remaining set of program states from the plurality of program states.

In some implementations, performing the second program pass on the memory cells includes programming the first subset of the memory cells and the second subset of the memory cells in the second program pass.

In some implementations, the plurality of program states are denoted as P(1), P(2), . . . , and P($2^N$−1), where N is an integer representing a number of bits stored per memory cell with N≥2. The two or more continuous program states include a set of program states from P(M) to P(M+K), wherein M and K are integers with M≥1 and K≥1.

In some implementations, the set of program states from P(M) to P(M+K) includes an initial set of program states from P(1) to P(1+K) with M=1. Performing the first program pass on the memory cells includes programming, in the first program pass, a second subset of the memory cells corresponding to a remaining set of program states from P(2+K) to P($2^N$−1). The first subset of the memory cells corresponding to the initial set of program states from P(1) to P(1+K) is inhibited from being programmed in the first program pass.

In some implementations, an initial program voltage applied to a word line to program the second subset of the memory cells in the first program pass is greater than an initial program voltage applied to the word line to program the memory cells in the second program pass.

In some implementations, the set of program states from P(M) to P(M+K) includes a middle set of program states from P(M) to P(M+K) with M>1 and M+K<$2^N$−1. Performing the first program pass on the memory cells includes programming, in the first program pass, a second subset of the memory cells corresponding to a remaining set of program states including a first remaining subset from P(1) to P(M−1) and a second remaining subset from P(M+K+1) to P($2^N$−1). The first subset of the memory cells corresponding to the middle set of program states from P(M) to P(M+K) is inhibited from being programmed in the first program pass.

In some implementations, the set of program states from P(M) to P(M+K) includes an ending set of program states from P(M) to P($2^N$−1) with M>1 and M+K=$2^N$−1. Performing the first program pass on the memory cells includes programming, in the first program pass, a second subset of the memory cells corresponding to a remaining set of program states from P(1) to P(M−1). The first subset of the memory cells corresponding to the ending set of program states from P(M) to P($2^N$−1) is inhibited from being programmed in the first program pass.

In some implementations, an ending program voltage applied to a word line to program the second subset of the memory cells in the first program pass is smaller than an ending program voltage applied to the word line to program the memory cells in the second program pass.

In another aspect, a memory device includes memory cells and a peripheral circuit coupled to the memory cells. The peripheral circuit is configured to perform a first program pass on the memory cells by skipping a programming on a first subset of the memory cells corresponding to a set of skipped program states. A target program state of each memory cell in the first subset is one of the set of skipped program states. The peripheral circuit is further configured to perform a second program pass on the memory cells.

In some implementations, to perform the first program pass on the memory cells by skipping the programming on the first subset of the memory cells, the peripheral circuit is configured to apply an inhibit voltage to a set of bit lines corresponding to the first subset of the memory cells to inhibit the programming on the first subset of the memory cells in the first program pass.

In some implementations, the memory cells are associated with an erased state and a plurality of program states. The set of skipped program states includes two or more continuous program states.

In some implementations, to perform the first program pass on the memory cells, the peripheral circuit is further configured to program, in the first program pass, a second subset of the memory cells corresponding to a remaining set of program states from the plurality of program states.

In some implementations, to perform the second program pass on the memory cells, the peripheral circuit is further configured to program the first subset of the memory cells and the second subset of the memory cells in the second program pass.

In some implementations, the plurality of program states are denoted as P(1), P(2), . . . , and P($2^N$−1), where N is an integer representing a number of bits stored per memory cell with N≥2. The two or more continuous program states include a set of program states from P(M) to P(M+K), where M and K are integers with M≥1 and K≥1.

In some implementations, the set of program states from P(M) to P(M+K) includes an initial set of program states from P(1) to P(1+K) with M=1. To perform the first program pass on the memory cells, the peripheral circuit is further configured to program, in the first program pass, a second subset of the memory cells corresponding to a remaining set of program states from P(2+K) to P($2^N$−1). The first subset of the memory cells corresponding to the initial set of program states from P(1) to P(1+K) is inhibited from being programmed in the first program pass.

In some implementations, an initial program voltage applied to a word line to program the second subset of the memory cells in the first program pass is greater than an initial program voltage applied to the word line to program the memory cells in the second program pass.

In some implementations, the set of program states from P(M) to P(M+K) includes a middle set of program states from P(M) to P(M+K) with M>1 and M+K<$2^N$−1. To perform the first program pass on the memory cells, the peripheral circuit is further configured to program, in the first program pass, a second subset of the memory cells corresponding to a remaining set of program states including a first remaining subset from P(1) to P(M−1) and a second remaining subset from P(M+K+1) to P($2^N$−1). The first subset of the memory cells corresponding to the middle set of program states from P(M) to P(M+K) is inhibited from being programmed in the first program pass.

In some implementations, the set of program states from P(M) to P(M+K) includes an ending set of program states from P(M) to P($2^N$−1) with M>1 and M+K=$2^N$−1. To perform the first program pass on the memory cells, the peripheral circuit is further configured to program, in the first program pass, a second subset of the memory cells corresponding to a remaining set of program states from P(1) to P(M−1). The first subset of the memory cells corresponding to the ending set of program states from P(M) to P($2^N$−1) is inhibited from being programmed in the first program pass.

In some implementations, an ending program voltage applied to a word line to program the second subset of the memory cells in the first program pass is smaller than an ending program voltage applied to the word line to program the memory cells in the second program pass.

In still another aspect, a system includes a memory device configured to store data and a memory controller coupled to the memory device and configured to control an operation of the memory device. The memory device includes memory cells and a peripheral circuit coupled to the memory cells. The peripheral circuit is configured to perform a first program pass on the memory cells by skipping a programming on a first subset of the memory cells corresponding to a set of skipped program states. A target program state of each memory cell in the first subset is one of the set of skipped program states. The peripheral circuit is further configured to perform a second program pass on the memory cells.

In some implementations, to perform the first program pass on the memory cells by skipping the programming on the first subset of the memory cells, the peripheral circuit is configured to apply an inhibit voltage to a set of bit lines corresponding to the first subset of the memory cells to inhibit the programming on the first subset of the memory cells in the first program pass.

In some implementations, the memory cells are associated with an erased state and a plurality of program states. The set of skipped program states includes two or more continuous program states.

In some implementations, to perform the first program pass on the memory cells, the peripheral circuit is further configured to program, in the first program pass, a second subset of the memory cells corresponding to a remaining set of program states from the plurality of program states.

In some implementations, to perform the second program pass on the memory cells, the peripheral circuit is further configured to program the first subset of the memory cells and the second subset of the memory cells in the second program pass.

In some implementations, the plurality of program states are denoted as P(1), P(2), . . . , and P($2^N$−1), where N is an integer representing a number of bits stored per memory cell with N≥2. The two or more continuous program states include a set of program states from P(M) to P(M+K), where M and K are integers with M≥1 and K≥1.

In some implementations, the set of program states from P(M) to P(M+K) includes an initial set of program states from P(1) to P(1+K) with M=1. To perform the first program pass on the memory cells, the peripheral circuit is further configured to program, in the first program pass, a second subset of the memory cells corresponding to a remaining set of program states from P(2+K) to P($2^N$−1). The first subset of the memory cells corresponding to the initial set of program states from P(1) to P(1+K) is inhibited from being programmed in the first program pass.

In some implementations, the set of program states from P(M) to P(M+K) includes a middle set of program states from P(M) to P(M+K) with M>1 and M+K<$2^N$−1. To perform the first program pass on the memory cells, the peripheral circuit is further configured to program, in the first program pass, a second subset of the memory cells corresponding to a remaining set of program states including a first remaining subset from P(1) to P(M−1) and a second remaining subset from P(M+K+1) to P($2^N$−1). The first subset of the memory cells corresponding to the middle set of program states from P(M) to P(M+K) is inhibited from being programmed in the first program pass.

In some implementations, the set of program states from P(M) to P(M+K) includes an ending set of program states from P(M) to P($2^N$−1) with M>1 and M+K=$2^N$−1. To perform the first program pass on the memory cells, the peripheral circuit is further configured to program, in the first program pass, a second subset of the memory cells corresponding to a remaining set of program states from P(1) to P(M−1). The first subset of the memory cells corresponding to the ending set of program states from P(M) to P($2^N$−1) is inhibited from being programmed in the first program pass.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 6E illustrates a table listing program pulses, program states, and verify levels applied in a program operation, according to some examples.

FIG. 7E illustrates a table listing program pulses, program states, and verify levels applied in a first program pass with a first set of skipped program states, according to some aspects of the present disclosure.

FIG. 8D illustrates another table listing program pulses, program states, and verify levels applied in a first program pass with a second set of skipped program states, according to some aspects of the present disclosure.

FIG. 9E illustrates a table listing program pulses, program states, and verify levels applied in a first program pass with a third set of skipped program states, according to some aspects of the present disclosure.

Figure 1:
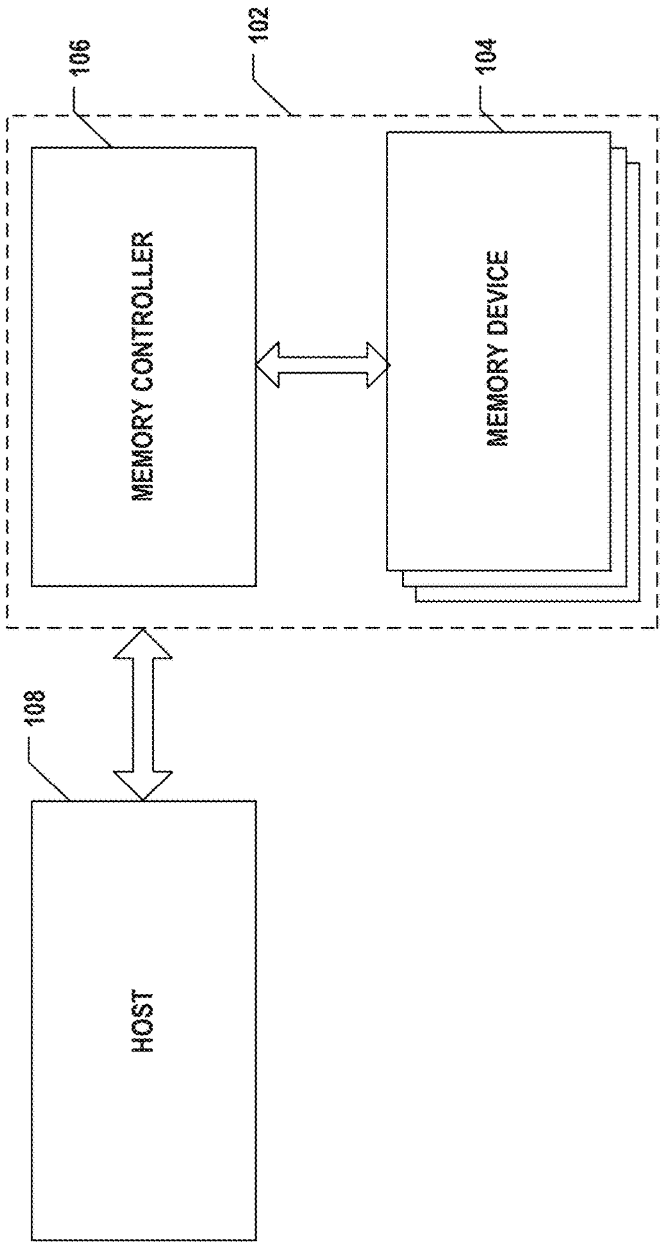
FIG. 1 illustrates a block diagram of a system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Nonvolatile (NV) memory devices such as NAND Flash memory devices can perform a program (write) operation at the page/word line level, i.e., programming all the memory cells coupled to the same select word line at the same time. For example, a single-pass program operation can be applied to program the memory cells coupled to the same select word line in one pass. In another example, a multi-pass program operation can be applied to program the memory cells coupled to the same select word line in multiple passes, which may include a first program pass (e.g., a coarse program pass) and a second program pass (e.g., a fine program pass). The multi-pass program operation takes a relatively long time (e.g., several hundred microseconds (μS)) as it may involve multiple passes, with each pass having multiple cycles of applying program pulses and verify pulses. Thus, the program time of the multi-pass program operation can be increased compared to that of the single-pass program operation.

To address one or more of the aforementioned issues, the present disclosure introduces a program scheme with skipped program states so that the program time can be reduced. Specifically, the program scheme disclosed herein can dynamically skip a set of program states in the first program pass such that a first subset of memory cells associated with the set of skipped program states are not programmed during the first program pass. Only a second subset of the memory cells associated with remaining program states are programmed in the first program pass. Afterwards, both the first subset and the second subset of the memory cells are programmed in the second program pass. By reducing the number of cycles of applying program/verify pulses in the first program pass, the program time of the multi-pass program operation can be reduced.

For example, assuming that memory cells to be programmed by the multi-pass program operation are configured to be programmed into respective ones of a plurality of program states. The plurality of program states can be divided into a set of skipped program states and a remaining set of program states. During a coarse program pass, a first subset of the memory cells whose target program states are in the set of skipped program states are not programmed, whereas only a second subset of the memory cells whose target program states are in the remaining set of the program states are programmed to respective intermediate levels. Afterwards, in a fine program pass, both the first subset of the memory cells and the second subset of the memory cells are programmed to their respective target program states. By inhibiting the programming of the first subset of the memory cells corresponding to the skipped program states in the coarse program pass, the total number of program pulses and the total number of verify pulses applied in the coarse program pass can be reduced. Therefore, the program time of the coarse program pass can be reduced.

FIG. 1 illustrates a block diagram of a system 100 including a memory system 102, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data (a.k.a. user data or host data) to or from memory system 102. Memory system 102 can be a storage product integrating memory controller 106 and one or more memory devices 104, such as an SSD.

Memory devices 104 can be any memory devices disclosed in the present disclosure, including non-volatile memory devices, such as NAND Flash memory devices. In some implementations, memory device 104 also includes one or more volatile memory devices, such as DRAM devices or static random-access memory (SRAM) devices.

Memory controller 106 is operatively coupled to memory devices 104 and host 108 and is configured to control memory devices 104, according to some implementations. Memory controller 106 can manage the data stored in memory devices 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment with SSDs or embedded multimedia card (eMMCs) used as data storage for mobile devices, such as smartphones, tablets, laptop computers, etc., and enterprise storage arrays. Memory controller 106 can be configured to control operations of memory devices 104, such as read, program/write, and/or erase operations. Memory controller 106 can also be configured to manage various functions with respect to the data stored or to be stored in memory devices 104 including, but not limited to bad-block management, garbage collection, logical-to-physical (L2P) address conversion, wear-leveling, etc. In some implementations, memory controller 106 is further configured to process error correction codes (ECCs) with respect to the data read from or written to memory devices 104. Any other suitable functions may be performed by memory controller 106 as well, for example, formatting memory devices 104. Memory controller 106 can communicate with an external device (e.g., host 108) according to a particular communication protocol. For example, memory controller 106 may communicate with the external device through at least one of various interface protocols, such as a non-volatile memory express (NVMe) protocol, an NVMe-over-fabrics (NVMe-oF) protocol, a PCI-express (PCI-E) protocol, a universal serial bus (USB) protocol, a multimedia card (MMC) protocol, a peripheral component interconnection (PCI) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
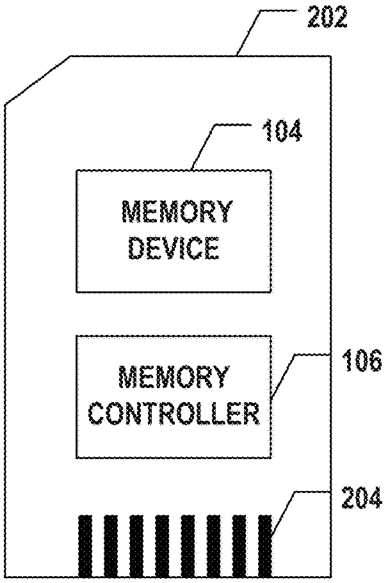
FIG. 2A illustrates a diagram of a memory card having a memory device, according to some aspects of the present disclosure.
Figure 2B:
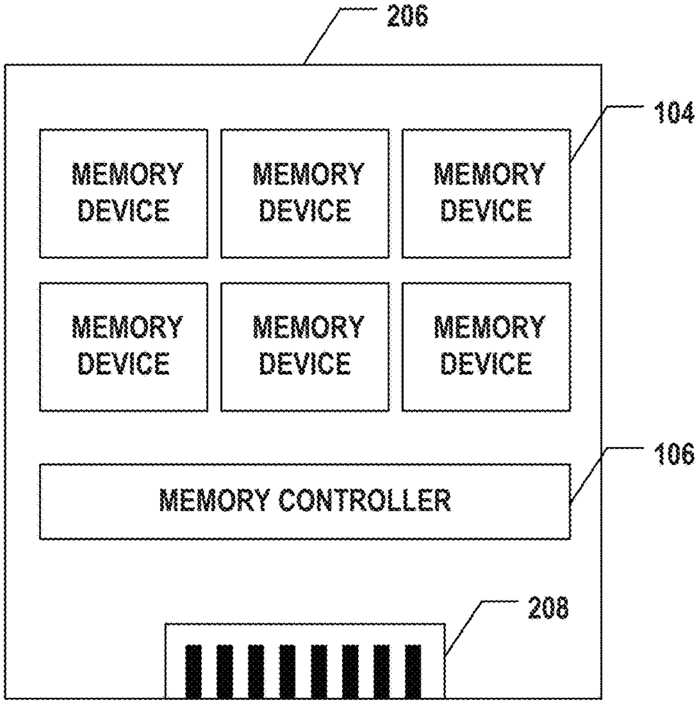
FIG. 2B illustrates a diagram of a solid-state drive (SSD) having a memory device, according to some aspects of the present disclosure.

Memory controller 106 and one or more memory devices 104 can be integrated into various types of storage devices, for example, being included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202. In some implementations, memory system 102 is implemented as an SSD 206 that includes both non-volatile memory devices and volatile memory devices as memory devices 104, such as an enterprise SSD.

Figure 3:
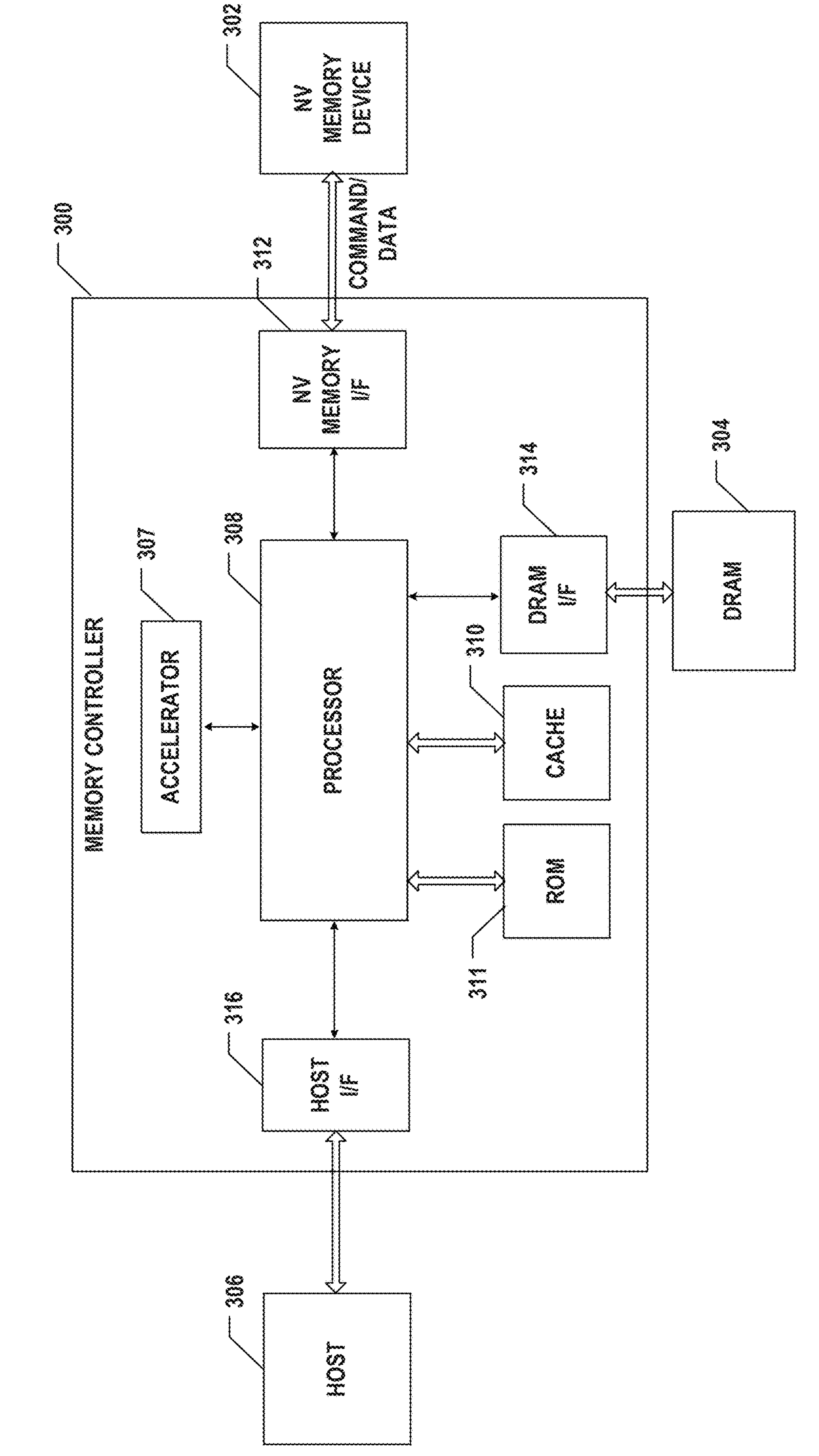
FIG. 3 illustrates a block diagram of a memory controller, according to some aspects of the present disclosure.

FIG. 3 illustrates a block diagram of a memory controller 300, according to some aspects of the present disclosure. Memory controller 300 may be one example of memory controller 106 in FIG. 1. As shown in FIG. 3, memory controller 300 can include a processor 308, an accelerator 307 (e.g., a hardware accelerator), a cache 310, and a read-only memory (ROM) 311. In some implementations, processor 308 is implemented by microprocessors (e.g., digital signal processors (DSPs)) or microcontrollers (a.k.a. microcontroller units (MCUs)) that execute firmware and/or software modules to perform the various functions described herein. The various firmware modules in memory controller 300 described herein can be implemented as firmware codes or instructions stored in ROM 311 and executed by processor 308. In some implementations, processor 308 includes one or more hardware circuits, for example, fixed logic units such as a logic gate, a multiplexer, a flip-flop, a state machine, field-programmable gate arrays (FPGAs), programmable logic devices (PLDs). For example, the hardware circuits may include dedicated circuits performing a given logic function that is known at the time of device manufacture, such as application-specific integrated circuits (ASICs).

As shown in FIG. 3, memory controller 300 can also include various input/output (I/O) interfaces (I/F), such as a non-volatile memory interface 312, a DRAM interface 314, and a host interface 316 operatively coupled to a non-volatile memory device 302 (e.g., flash memory), DRAM 304 (e.g., an example of volatile memory devices), and a host 306 (e.g., an example of host 108), respectively. Non-volatile memory interface 312, DRAM interface 314, and host interface 316 can be configured to transfer data, command, clock, or any suitable signals between processor 308 and non-volatile memory device 302, DRAM 304, and host 306, respectively. Non-volatile memory interface 312, DRAM interface 314, and host interface 316 can implement any suitable communication protocols facilitating data transfer, communication, and management, such as the NVMe protocol and PCI-E protocol, double data rate (DDR) protocol, to name a few.

As described above, both cache 310 and DRAM 304 may be considered volatile memory devices that can be controlled and accessed by memory controller 300 in a memory system. In some implementations, a cache can be implemented as part of volatile memory devices, for example, by an SRAM and/or DRAM 304. It is understood that although FIG. 3 shows that cache 310 is within memory controller 300 and DRAM 304 is outside of memory controller 300, in some examples both cache 310 and DRAM 304 may be within memory controller 300 or outside of memory controller 300.

Figure 4:
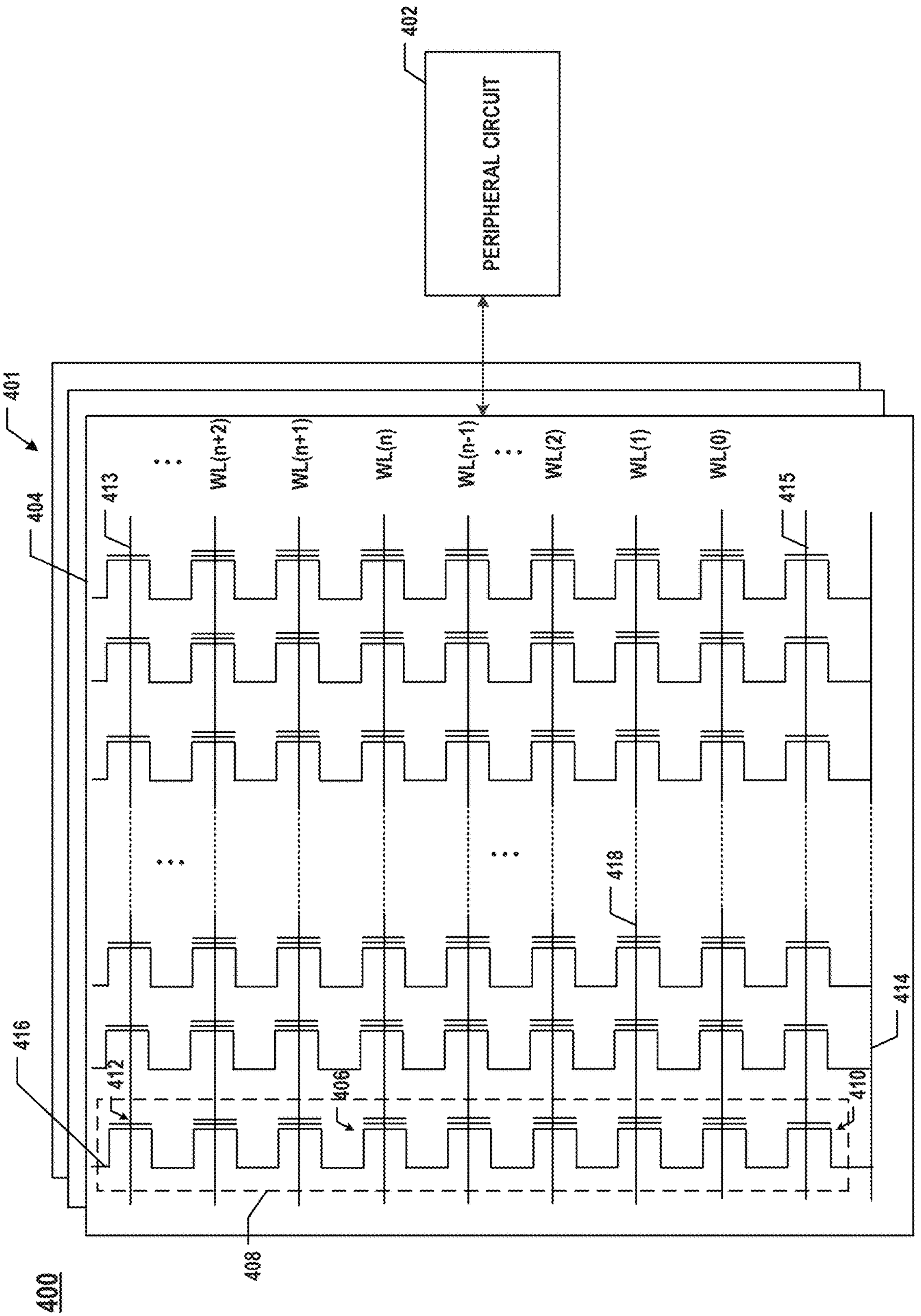
FIG. 4 illustrates a schematic diagram of a memory device including peripheral circuits, according to some aspects of the present disclosure.

FIG. 4 illustrates a schematic diagram of a memory device 400 including peripheral circuits 402, according to some aspects of the present disclosure. Memory device 400 can be an example of memory device 104 in FIG. 1. Memory device 400 can include a memory cell array 401 and peripheral circuits 402 coupled to memory cell array 401. Memory cell array 401 can be a NAND Flash memory cell array in which memory cells 406 are provided in an array of NAND memory strings 408 each extending vertically above a substrate (not shown). In some implementations, each NAND memory string 408 includes a plurality of memory cells 406 coupled in series and stacked vertically. Each memory cell 406 can hold a continuous, analog value, such as an electrical voltage or charge, that depends on the number of electrons trapped within a region of memory cell 406. Each memory cell 406 can be either a floating gate type of memory cell including a floating-gate transistor or a charge trap type of memory cell including a charge-trap transistor.

In some implementations, each memory cell 406 is a single-level cell (SLC) that has two possible memory states and thus, can store one bit of data. For example, the first memory state “0” can correspond to a first range of voltages, and the second memory state “1” can correspond to a second range of voltages. In some implementations, each memory cell 406 is a multi-level cell (MLC) that is capable of storing more than a single bit of data in more than four memory states. For example, the MLC can store two bits per cell, three bits per cell (also known as TLC), or four bits per cell (also known as QLC). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 4, each NAND memory string 408 can also include a source select gate (SSG) transistor 410 at its source end and a drain select gate (DSG) transistor 412 at its drain end. SSG transistor 410 and DSG transistor 412 can be configured to activate select NAND memory strings 408 (columns of the array) during read and program operations. In some implementations, the sources of NAND memory strings 408 in the same block 404 are coupled through a same source line (SL) 414, e.g., a common SL. In other words, all NAND memory strings 408 in the same block 404 have an array common source (ACS), according to some implementations. The drain of each NAND memory string 408 is coupled to a respective bit line 416 from which data can be read or written via an output bus (not shown), according to some implementations. In some implementations, each NAND memory string 408 is configured to be selected or deselected by applying a DSG select voltage or a DSG unselect voltage to the gate of respective DSG transistor 412 through one or more DSG lines 413 and/or by applying an SSG select voltage or an SSG unselect voltage to the gate of respective SSG transistor 410 through one or more SSG lines 415.

As shown in FIG. 4, NAND memory strings 408 can be organized into multiple blocks 404, each of which can have a common source line 414, e.g., coupled to an ACS. In some implementations, each block 404 is the basic data unit for erase operations, i.e., all memory cells 406 on the same block 404 are erased at the same time. To erase memory cells 406 in a select block 404, source lines 414 coupled to select block 404 as well as unselect blocks 404 in the same plane as select block 404 can be biased with an erase voltage (Vers), such as a high positive voltage (e.g., 20 V or more). Memory cells 406 of adjacent NAND memory strings 408 can be coupled through word lines 418 that select which row of memory cells 406 is affected by read and program operations. Each word line 418 can include a plurality of control gates (gate electrodes) at each memory cell 406 coupled to word line 418 and a gate line coupling the control gates. With reference to FIG. 4, a plurality of word lines WL(0), WL(1), WL(2), . . . , WL(n−1), WL(n), WL(n+1), and WL(n+2) are illustrated, with n being a positive integer.

Figure 5A:
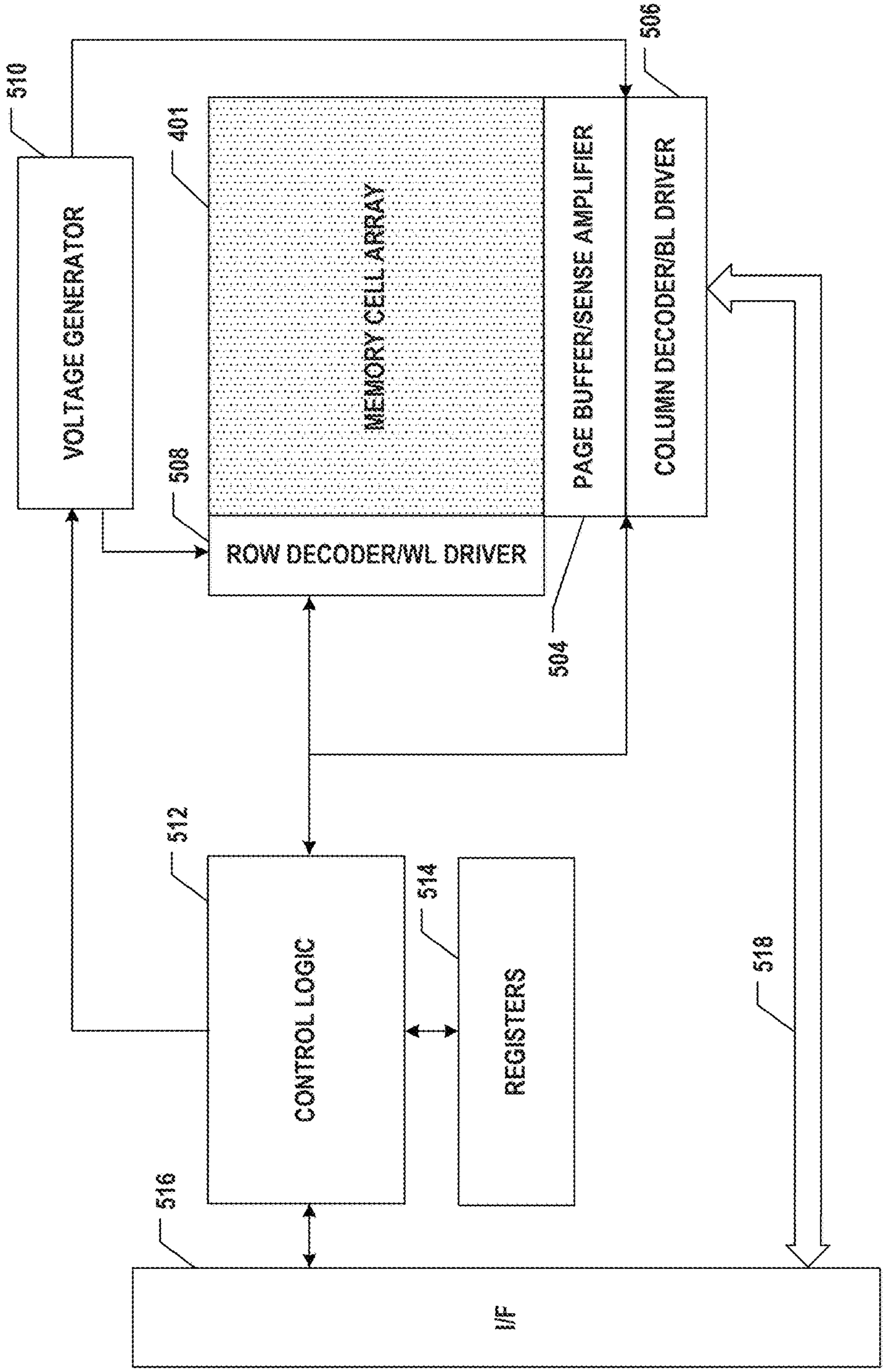
FIG. 5A illustrates a block diagram of a memory device including a memory cell array and peripheral circuits, according to some aspects of the present disclosure.

Peripheral circuits 402 can be coupled to memory cell array 401 through bit lines 416, word lines 418, source lines 414, SSG lines 415, and DSG lines 413. Peripheral circuits 402 can include any suitable analog, digital, and mixed-signal circuits for facilitating the operations of memory cell array 401 by applying and sensing voltage signals and/or current signals to and from each target memory cell 406 through bit lines 416, word lines 418, source lines 414, SSG lines 415, and DSG lines 413. Peripheral circuits 402 can include various types of peripheral circuits formed using metal-oxide-semiconductor (MOS) technologies. For example, FIG. 5A illustrates some peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5A may be included as well.

Page buffer/sense amplifier 504 can be configured to read and program (write) data from and to memory cell array 401 according to the control signals from control logic 512. In one example, page buffer/sense amplifier 504 may store one page of program data (write data) to be programmed into a page of memory cell array 401. In another example, page buffer/sense amplifier 504 may verify programmed target memory cells 406 in each program/verify loop (cycle) in a program operation to ensure that the data has been properly programmed into memory cells 406 coupled to select word lines 418. In still another example, page buffer/sense amplifier 504 may also sense the low power signals from bit line 416 that represents a data bit stored in memory cell 406 and amplify the small voltage swing to recognizable logic levels in a read operation. In program operations, page buffer/sense amplifier 504 can include storage modules (e.g., latches, caches, registers, etc.) for temporarily storing a set of N-bits data (e.g., in the form of gray codes) received from data bus 518 and providing the set of N-bits data to a corresponding target memory cell 406 through the corresponding bit line 416 in each program pass of a multi-pass program operation.

Column decoder/bit line driver 506 can be configured to be controlled by control logic 512 and select one or more NAND memory strings 408 by applying bit line voltages generated from voltage generator 510. Row decoder/word line driver 508 can be configured to be controlled by control logic 512 and select/deselect blocks 404 of memory cell array 401 and select/deselect word lines 418 of block 404. Row decoder/word line driver 508 can be further configured to drive word lines 418 using word line voltages generated from voltage generator 510. In some implementations, row decoder/word line driver 508 can also select/deselect and drive SSG lines 415 and DSG lines 413 as well. Voltage generator 510 can be configured to be controlled by control logic 512 and generate the word line voltages (e.g., read voltage, program voltage, channel pass voltage, local voltage, verify voltage, etc.), bit line voltages, and source line voltages to be supplied to memory cell array 401.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit. Interface 516 can be coupled to control logic 512 and act as a control buffer to buffer and relay control commands received from a host (e.g., 108 in FIG. 1) to control logic 512 and status information received from control logic 512 to the host. Interface 516 can also be coupled to column decoder/bit line driver 506 via data bus 518 and act as a data input/output (I/O) interface and a data buffer to buffer and relay the data to and from memory cell array 401.

Figure 5B:
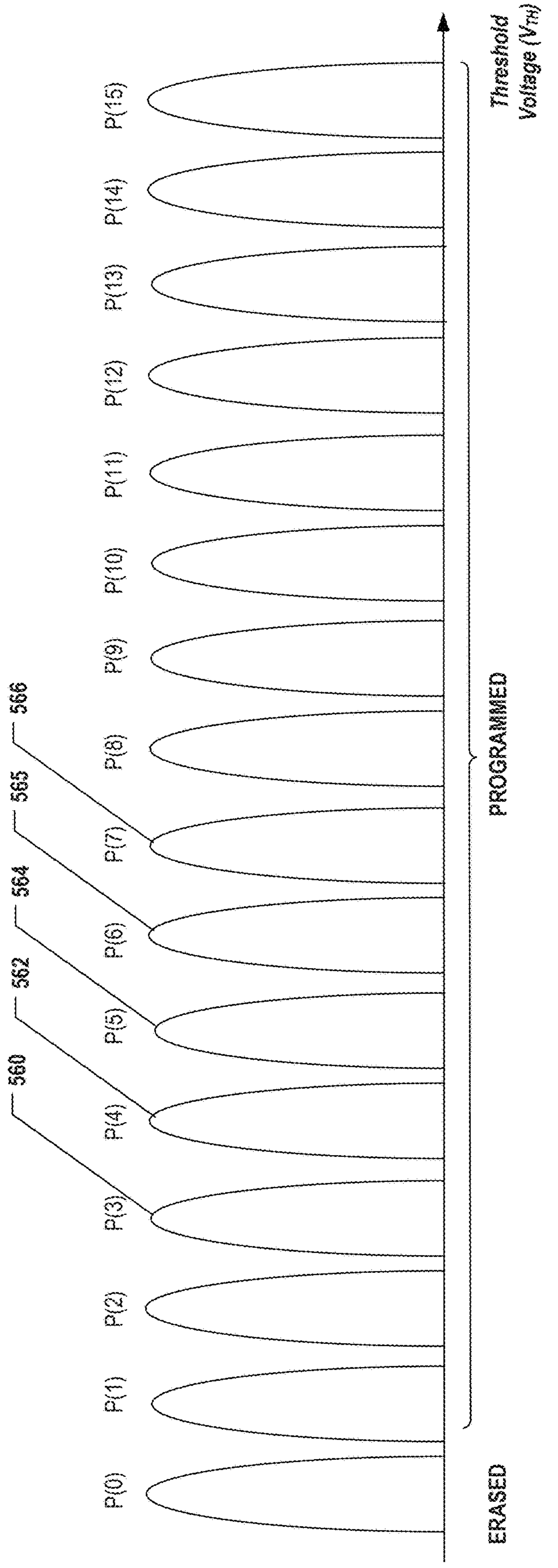
FIG. 5B illustrates threshold voltage distributions of memory cells in a program operation, according to some aspects of the present disclosure.

FIG. 5B illustrates threshold voltage distributions of memory cells in a program operation, according to some aspects of the present disclosure. As described above, each memory cell 406 can be configured to store a set of N-bits data in one of $2^N$ levels, where N is an integer greater than 1 (e.g., N=2 for MLCs, N=3 for TLCs, N=4 for QLCs, etc.). Each level can correspond to one of $2^N$ threshold voltage (Vth) ranges of memory cells 406. Considering a multi-pass program operation in which memory cell 406 may be programmed into an intermediate level first in a coarse program pass, the "level" referred to herein may be considered as the final level after the fine program pass of the multi-pass program operations, in contrast to the intermediate level. Taking QLCs, where N=4, for example, as shown in FIG. 5B, memory cell 406 may be programmed into one of the 16 levels, including one level of the erased state ("P(0)") and 15 levels of the program states (program states "P(1)-P(15)"). Each level may correspond to a respective threshold voltage (Vth) range of memory cells 406. For example, the level corresponding to the lowest threshold voltage range (the left-most threshold voltage distribution in FIG. 5B) may be considered as level 0, the level corresponding to the second-lowest threshold voltage range (the second left-most threshold voltage distribution in FIG. 5B) may be considered as level 1, and so until level 15 corresponding to the highest threshold voltage range (the right-most threshold voltage distribution in FIG. 5B).

Consistent with some aspects of the present disclosure, two program states can be continuous program states if their respective threshold voltage distributions are adjacent to one another. Three or more program states can be continuous program states if each pair of adjacent program states in the three or more program states are continuous program states. For example, with reference to FIG. 5B, program states (P(3), P(4)) are continuous program states since their respective threshold voltage distributions 560 and 562 are adjacent to one another. Program states (P(3), P(4), P(5)) are continuous program states since each pair of adjacent program states, e.g., (P(3), P(4)) and (P(4), P(5)), are continuous program states. On the contrary, program states (P(5), P(7)) are not continuous program states since their respective threshold voltage distributions 564 and 566 are not adjacent to one another (e.g., threshold voltage distributions 564 and 566 of (P(5), P(7)) are separated by a threshold voltage distribution 565 of P(6)). That is, program states (P(5), P(7)) are separated by the program state P(6). Program states (P(3), P(5), P(7)) are not continuous program states since a first pair of adjacent program states (P(3), P(5)) and a second pair of adjacent program states (P(5), P(7)) in (P(3), P(5), P(7)) are not continuous program states.

Figure 6A:
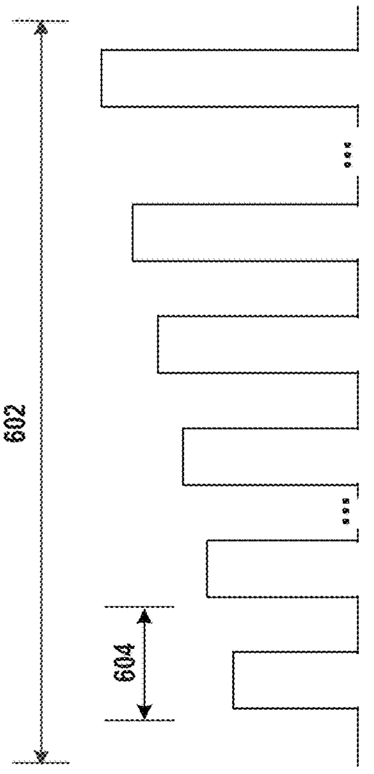
FIGS. 6A-6B illustrate a waveform of word line voltages applied to a select word line in a first program pass, according to some examples.
Figure 6B:
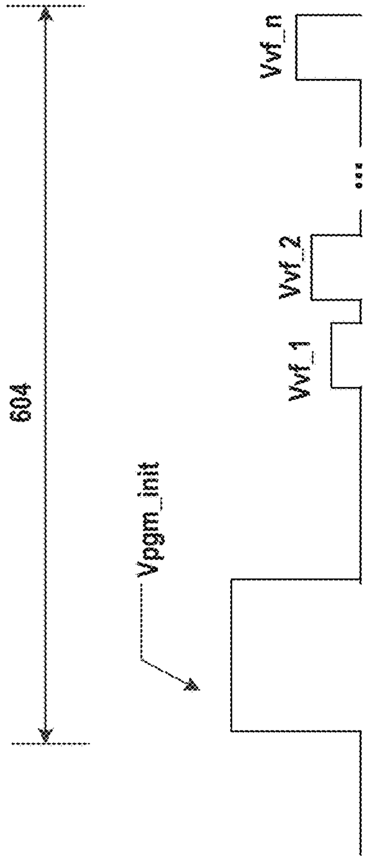

FIGS. 6A-6B illustrate a waveform of word line voltages applied to a select word line in a first program pass, according to some examples. In program operations, the data may be programmed (written) into xLCs, such as TLCs, QLCs, etc. For xLCs, a multi-pass program operation can involve a coarse program pass that programs the xLCs to respective ones of the intermediate levels, as well as a fine program pass that programs the xLCs from the intermediate levels to the final levels.

As shown in FIG. 6A, the multi-pass program operation includes at least a first program pass 602 (a.k.a., a coarse program pass, e.g., a non-last program pass). First program pass 602 includes one or more program/verify loops (or referred to as program/verify cycles). In each program/verify loop, a program voltage is applied to a select word line, followed by a number of verify voltages with incremental changes of voltage levels. For example, an initial program/verify loop 604 of first program pass 602 is shown in FIGS. 6A-6B. In initial program/verify loop 604, a program voltage (Vpgm_init) is applied to the select word line, followed by a number of verify voltages (Vvf_1, Vvf_2, . . . , Vvf_n), where n is a positive integer (n≥1). Vvf_1 may indicate a verify voltage for the program state P(1) in first program pass 602. Vvf_2 may indicate a verify voltage for the program state P(2) in first program pass 602. Similarly, Vvf_n may indicate a verify voltage for the program state P(n) in first program pass 602.

In some implementations, incremental step pulse programming (ISPP) can be applied in first program pass 602. In some implementations, the program voltages, the number of program/verify loops, the widths of the program pulses, a step size of the program pulses, or other program/verify parameters can be adjusted for different dies in the memory device, which is not limited herein.

Figure 6C:
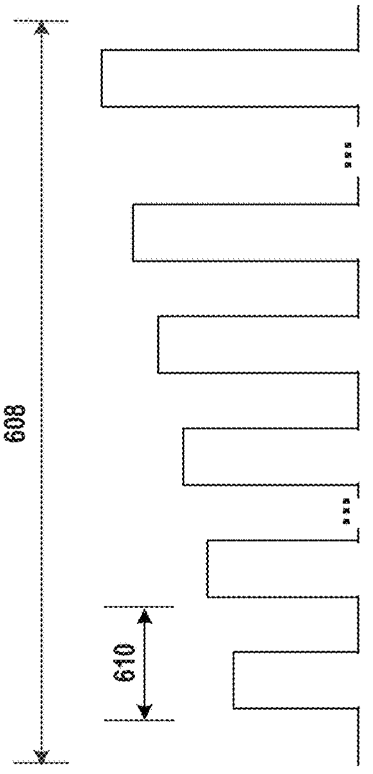
FIGS. 6C-6D illustrate a waveform of word line voltages applied to a select word line in a second program pass, according to some examples.
Figure 6D:
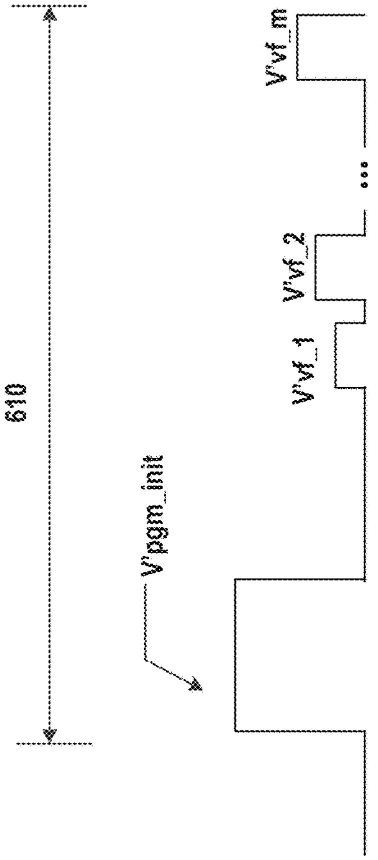

FIGS. 6C-6D illustrate a waveform of word line voltages applied to a select word line in a second program pass, according to some examples. As shown in FIGS. 6C-6D, the multi-pass program operation further includes a second program pass 608 (a.k.a., a fine program pass, e.g., a last program pass). Second program pass 608 may be performed after first program pass 602. Second program pass 608 may also include one or more program/verify loops. In each program/verify loop, a program voltage is applied to the select word line, followed by a number of verify voltages with incremental changes of voltage levels. For example, an initial program/verify loop 610 of second program pass 608 is shown in FIGS. 6C-6D. In initial program/verify loop 610, a program voltage (V'pgm_init) is applied to the select word line, followed by a number of verify voltages (V'vf_1, V'vf_2, . . . , V'vf_m), where m is a positive integer ($m \geq 1$). V'vf_1 may indicate a verify voltage for the program state P(1) in second program pass 608. V'vf_2 may indicate a verify voltage for the program state P(2) in second program pass 608. V'vf_m may indicate a verify voltage for the program state P(m) in second program pass 608.

In some implementations, ISPP can be applied in second program pass 608. In some implementations, the program voltages, the number of program/verify loops, the widths of the program pulses, a step size of the program pulses, or other program/verify parameters can be adjusted for different dies in the memory device, which is not limited herein.

FIG. 6E illustrates a table (Table 1) listing program pulses, program states, and verify levels applied in a program operation (e.g., a first program pass of a multi-pass program operation), according to some examples. Table 1 can be used to program TLCs associated with an erased state P0 and a plurality of program states P(1)-P(7). The program operation (or the first program pass of the multi-pass program operation) can be performed on a set of memory cells coupled to a select word line, where each memory cell in the set is configured to be programmed into the erased state P(0) or one of the program states P(1)-P(7) (e.g., each memory cell has a target program state to be one of P(0)-P(7)).

In a $1^{st}$ program/verify loop, a $1^{st}$ program pulse (Pulse 1) can be applied to the select word line to program memory cells with the target program states P(1)-P(7). Then, a first verify level corresponding to the first program state P(1) can be applied to verify whether memory cells with the target program state P(1) pass the first verify level (e.g., whether threshold voltages of the memory cells with the target program state P(1) are greater than or equal to the first verify level).

Next, in a $2^{nd}$ program/verify loop, a $2^{nd}$ program pulse (Pulse 2) can be applied to the select word line to program (a) memory cells with the target program states P(2)-P(7) and (b) memory cells with the target program state P(1) but having not passed the first verify level in the $1^{st}$ program/verify loop. Again, the first verify level can be applied to verify whether the memory cells with the target program state P(1) but having not passed the first verify level in the 1st program/verify loop would pass the first verify level.

In a $3^{rd}$ program/verify loop, a second verify level corresponding to the second program state P(2) is started to be used in the verification. For example, a $3^{rd}$ program pulse (Pulse 3) can be applied to the select word line to program (a) memory cells with the target program states P(2)-P(7) and (b) memory cells with the target program state P(1) but having not passed the first verify level in the $1^{st}$ and $2^{nd}$ program/verify loops. Again, the first verify level can be applied to verify whether the memory cells with the target program state P(1) but having not passed the first verify level in the $1^{st}$ and $2^{nd}$ program/verify loops would pass the first verify level. Also, the second verify level can be applied to verify whether memory cells with the target program state P(2) pass the second verify level. Similar operations can be performed in other program/verify loops (e.g., the $4^{th}$ program/verify loop to the $17^{th}$ program/verify loop), and the similar description will not be repeated herein.

Figure 6F:
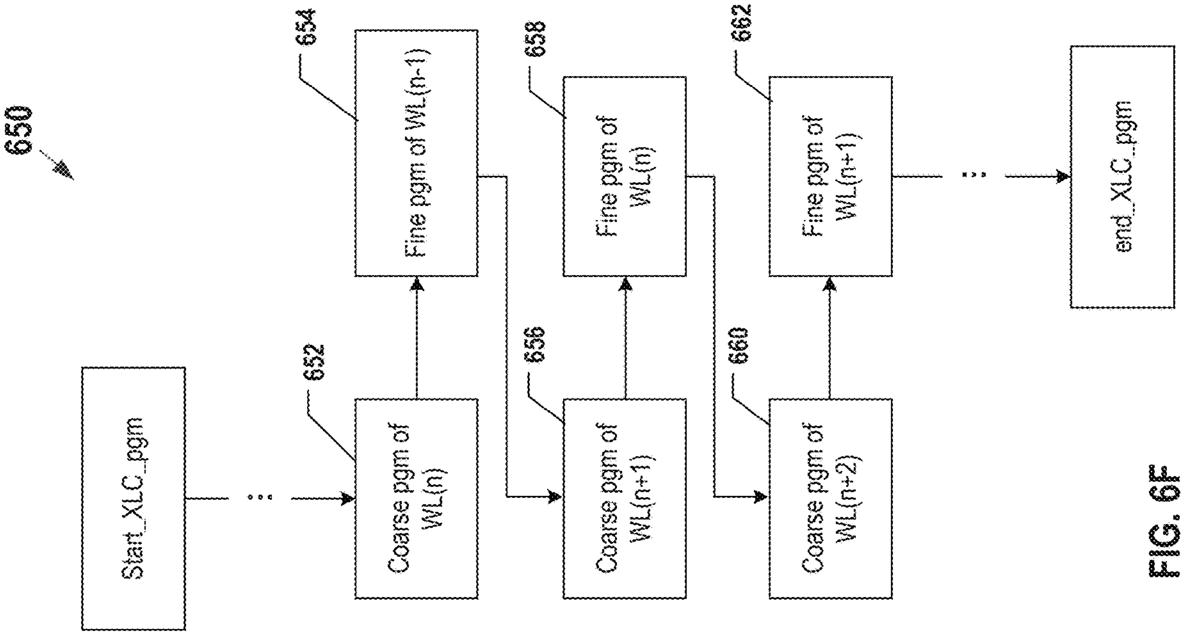
FIG. 6F illustrates a process for performing multi-pass program operations in a memory device, according to some examples.

FIG. 6F illustrates a process 650 for performing multi-pass program operations in a memory device, according to some examples. Process 650 may be executed by peripheral circuits of the memory device (e.g., peripheral circuits 402 of FIG. 4). The multi-pass program operations may be performed with respect to a plurality of word lines (e.g., WL(n−1), WL(n), WL(n+1)), respectively. Taking XLCs as examples, a coarse program pass and a fine program pass may be performed with respect to each word line. For example, a coarse program pass 652 associated with the word line WL(n) can be performed. Before coarse program pass 652, a coarse program pass associated with the word line WL(n−1) (not shown in FIG. 6F) can be performed. Following coarse program pass 652, a fine program pass 654 associated with the word line WL(n−1) can be performed. Subsequently, a coarse program pass 656 associated with the word line WL(n+1), a fine program pass 658 associated with the word line WL(n), a coarse program pass 660 associated with the word line WL(n+2), and a fine program pass 662 associated with the word line WL(n+1), and so on and so forth, can be performed sequentially.

Figure 6G:
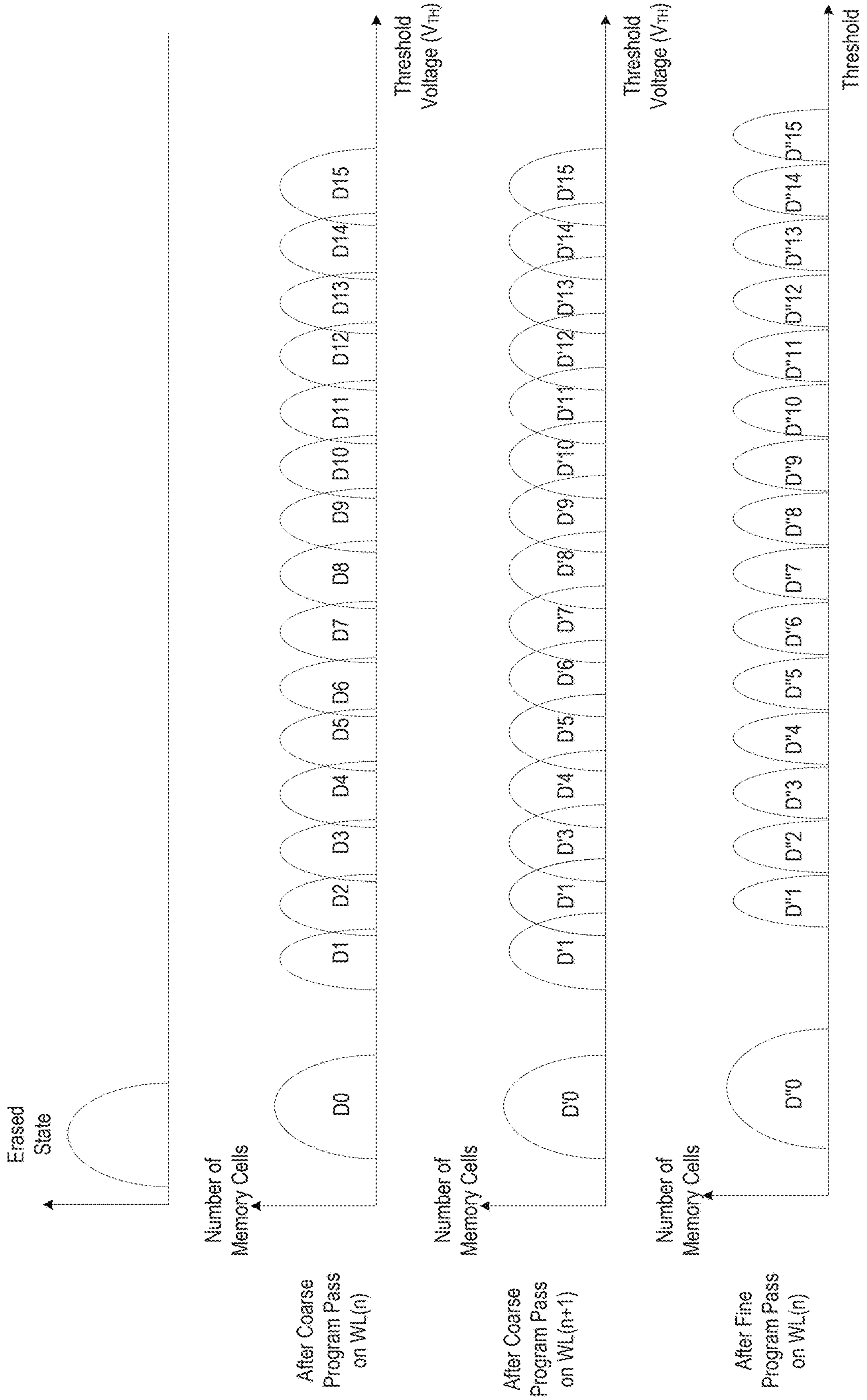
FIG. 6G illustrates threshold voltage distributions of memory cells in a multi-pass program operation according to some examples.

FIG. 6G illustrates threshold voltage distributions of memory cells in a multi-pass program operation according to some examples. By taking QLCs as examples, memory cells are first programmed into 16 intermediate levels in the first program pass (e.g., coarse program pass) by applying 15 verify voltages each between two adjacent intermediate levels. For example, after the coarse program pass on the word line WL(n) is performed, a curve D0 may represent a threshold voltage distribution of the erased state (P0), and curves D1, D2, . . . , D15 may represent threshold voltage distributions of the program states P(1), P(2), . . . , P(15), respectively. Afterwards, the coarse program pass on the word line WL(n+1) is performed. Then, curves D1, D2, . . . , D15 may become wider due to the coupling effect between the word lines WL(n) and WL(n+1). That is, curves D0, D1, D2, . . . , D15 may be changed to curves D'0, D'1, D'2, . . . , D'15, which represent respective threshold voltage distributions of the program states P(1), P(2), . . . , P(15) after the coarse program pass on the word line WL(n+1) is performed.

In the second program pass (e.g., fine program pass), by applying a larger program voltage, the threshold voltages of the memory cells that are programmed into the intermediate levels are shifted up to respective final levels each with a reduced width of the threshold voltage distribution (i.e., a narrower range). D"0, D"1, D"2, . . . , D"15 may represent threshold voltage distributions of the erased state P0 and the program states P(1), P(2), . . . , P(15), respectively, after the fine program pass on the word line WL(n) is performed.

Consistent with the scope of the present disclosure, the program scheme with skipped program states disclosed herein can be applied in a memory device to reduce the program time of the memory device. The memory device may include memory cells and can be any non-volatile memory device disclosed herein (e.g., memory device 104, 302, or 400). The program scheme disclosed herein can be implemented by a peripheral circuit (e.g., peripheral circuit 402) of the memory device. It is contemplated that a part of or all the functionality of the program scheme disclosed herein may also be performed by other components of the memory device or a memory controller coupled to the memory device, which is not limited herein.

The memory cells of the memory device can be associated with an erased state and a plurality of program states, where the plurality of program states can be divided into (a) a set of skipped program states and (b) a remaining set of program states. The memory cells of the memory device may include (a) a first subset of the memory cells corresponding to the set of skipped program states and (b) a second subset of the memory cells corresponding to the remaining set of program states. A target program state of each memory cell in the first subset can be one of the set of skipped program states, whereas a target program state of each memory cell in the second subset can be one of the remaining set of program states. For example, each memory cell in the first subset may be configured to be programmed into one of the skipped program states, whereas each memory cell in the second subset may be configured to be programmed into one of the remaining set of program states.

Consistent with some aspects of the present disclosure, the peripheral circuit of the memory device can be configured to perform a first program pass on the memory cells by skipping a programming on the first subset of the memory cells. Specifically, in the first program pass, the peripheral circuit may be configured to program the second subset of the memory cells, whereas the first subset of the memory cells can be inhibited from being programmed. For example, in the first program pass, the peripheral circuit may apply an inhibit voltage to a set of bit lines corresponding to the first subset of the memory cells to inhibit the programming on the first subset of the memory cells. Meanwhile, the peripheral circuit may apply respective bias level voltages to another set of bit lines corresponding to the second subset of the memory cells to allow the programming on the second subset of the memory cells. In some implementations, the inhibit voltage can be a high-level voltage. The bias level voltages can be voltages lower than the inhibit voltage. For example, the bias level voltages can include two voltage levels (e.g., high and low bias levels) or three voltage levels (e.g., high, medium, and low bias levels, referred to herein as 3BL).

The set of skipped program states may include two or more continuous program states. For example, the erased state can be denoted as P(0), and the plurality of program states can be denoted as P(1), P(2), . . . , and P($2^N$−1), where N is an integer representing a number of bits stored per memory cell with N≥2. The two or more continuous program states may include a set of program states from P(M) to P(M+K), with M and K being integers, M≥1, and K≥1. In some implementations, the set of skipped program states from P(M) to P(M+K) may include an initial set of program states from P(1) to P(1+K) when M=1. Example implementations of the program scheme disclosed herein, with the set of skipped program states being an initial set of program states are provided below with reference to FIGS. 7A-7E. In some implementations, the set of skipped program states from P(M) to P(M+K) may include a middle set of program states from P(M) to P(M+K) with M>1 and M+K<$2^N$−1. Example implementations of the program scheme disclosed herein, with the set of skipped program states being a middle set of program states are provided below with reference to FIGS. 8A-8D. In some implementations, the set of skipped program states from P(M) to P(M+K) may include an ending set of program states from P(M) to P($2^N$−1) with M>1 and M+K=$2^N$−1. Example implementations of the program scheme disclosed herein, with the set of skipped program states being an ending set of program states are provided below with reference to FIGS. 9A-9E.

Consistent with some aspects of the present disclosure, the peripheral circuit may be further configured to perform a second program pass on the memory cells of the memory device. For example, the peripheral circuit may be configured to program the first and second subsets of the memory cells in the second program pass, so that both the first and second subsets of the memory cells can be programmed into their respective target program states in the second program pass.

Figure 7A:
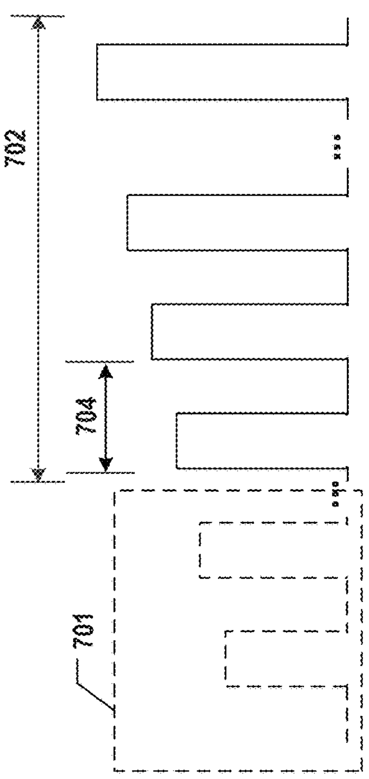
FIGS. 7A-7B illustrate a waveform of word line voltages applied to a select word line in a first program pass with a first set of skipped program states, according to some aspects of the present disclosure.
Figure 7B:
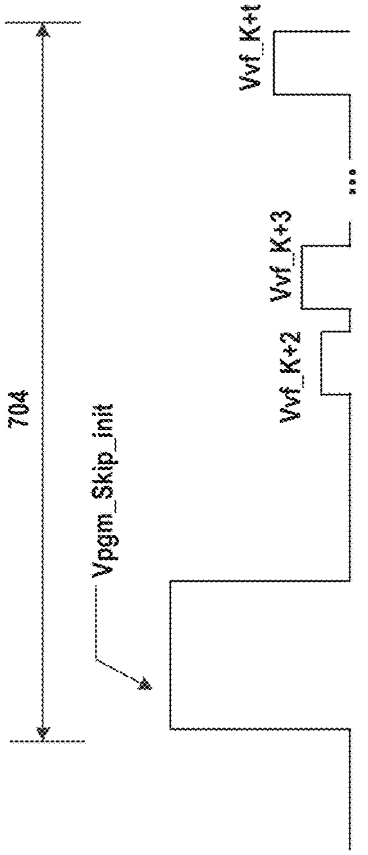

FIGS. 7A-7B illustrate a waveform of word line voltages applied to a select word line of a memory device in a first program pass 702 having a first set of skipped program states, according to some aspects of the present disclosure. The memory device may include memory cells and can be any non-volatile memory device disclosed herein (e.g., memory device 104, 302, or 400). In first program pass 702, the first set of skipped program states may include an initial set of program states from P(1) to P(1+K) with K≥1. A remaining set of program states may include P(2+K) to P($2^N$−1). A first subset of the memory cells may correspond to the initial set of program states, whereas a second subset of the memory cells may correspond to the remaining set of program states. For example, each memory cell in the first subset may be configured to be programmed into one of the initial set of program states, whereas each memory cell in the second subset may be configured to be programmed into one of the remaining set of program states. The peripheral circuit of the memory device may be configured to program the second subset of the memory cells and meanwhile inhibit the programming of the first subset of the memory cells during first program pass 702.

For example, an initial program/verify loop 704 of first program pass 702 is shown in FIGS. 7A-7B. In initial program/verify loop 704, an initial program voltage (Vpgm_skip_init) is applied to the select word line, followed by a number of verify voltages (Vvf_K+2, Vvf_K+3, . . . , Vvf_K+t) with incremental changes of voltage levels, where t is a positive integer (t≥2). Vvf_K+2 may indicate a verify voltage for the program state P(K+2). Vvf_K+3 may indicate a verify voltage for the program state P(K+3). Vvf_K+t may indicate a verify voltage for the program state P(K+t). The program voltage (Vpgm_skip_init), as well as other program voltages in following program/verify loops, is used to program the second subset of the memory cells corresponding to the remaining set of program states from P(2+K) to P($2^N$−1).

Compared with FIG. 6A where the initial verify voltage of initial program/verify loop 604 is the verify voltage Vvf_1 for the program state P(1), the initial verify voltage of initial program/verify loop 704 in FIG. 7A is the verify voltage Vvf_K+2 for the program state P(K+2). A plurality of program/verify loops 701 associated with the initial set of program states from P(1) to P(1+K) are depicted with dashed lines in a dashed box in FIG. 7A. The plurality of program/verify loops 701 are omitted in first program pass 702. In some implementations, the plurality of program/verify loops 701 may include a part of the program/verify loops of FIG. 6A before the program state P(K+2) is started to be verified (e.g., before the verify voltage Vvf_K+2 is applied to verify threshold voltages of memory cells having the target program state P(K+2)). An example of the plurality of program/verify loops omitted in the first program pass is illustrated below in FIG. 7E.

Figure 7C:
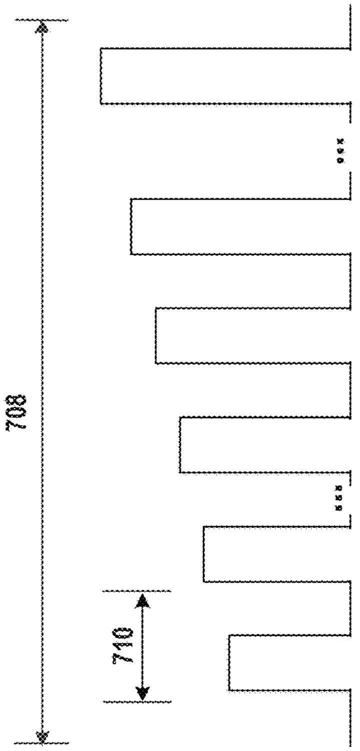
FIGS. 7C-7D illustrate a waveform of word line voltages applied to a select word line in a second program pass following the first program pass of FIGS. 7A-7B, according to some aspects of the present disclosure.
Figure 7D:
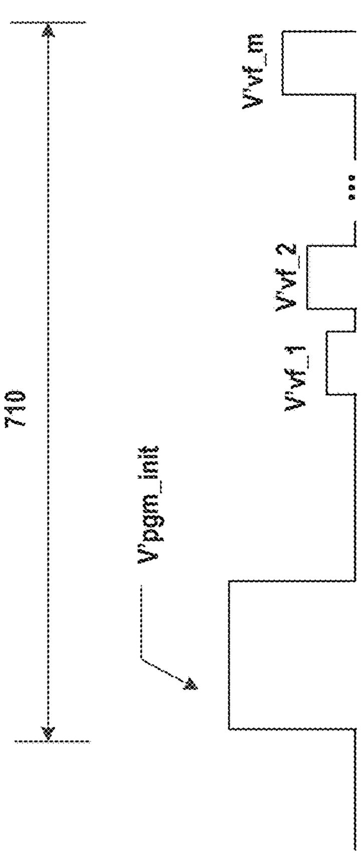

FIGS. 7C-7D illustrate a waveform of word line voltages applied to a select word line in a second program pass 708 following first program pass 702, according to some aspects of the present disclosure. Second program pass 708 may be performed after first program pass 702. Second program pass 708 also includes one or more program/verify loops. In each program/verify loop, a program voltage is applied to the select word line, followed by a number of verify voltages with incremental changes of voltage levels. For example, an initial program/verify loop 710 of second program pass 708 is shown in FIGS. 7C-7D. In program/verify loop 710, an initial program voltage (V'pgm_init) is applied to the select word line, followed by a number of verify voltages (V'vf_1, V'vf_2, . . . , V'vf_m) with incremental changes of voltage levels, where m is a positive integer (m≥1). V'vf_1 may indicate a verify voltage for the program state P(1). V'vf_2 may indicate a verify voltage for the program state P(2). V'vf_m may indicate a verify voltage for the program state P(m).

With reference to FIGS. 7B and 7D, the initial program voltage (Vpgm_skip_init) applied to the select word line to program the second subset of the memory cells in first program pass 702 can be greater than the initial program voltage (V'pgm_init) applied to the select word line to program both the first and second subsets of the memory cells in second program pass 708. That is, Vpgm_skip_init>V'pgm_init in FIGS. 7B and 7D, whereas Vpgm_init<V'pgm_init in FIGS. 6B and 6D.

FIG. 7E illustrates a table (Table 2) listing program pulses, program states, and verify levels applied in a first program pass having an initial set of skipped program states, according to some aspects of the present disclosure. Table 2 can be used to program TLCs. It is contemplated that although FIG. 7E is described below with reference to TLCs, the similar description can also be applied to any other XLCs, such as QLCs, which is not limited herein. The initial set of skipped program states in FIG. 7E may include two continuous program states (P(1), P(2)).

Compared with FIG. 6E, the first to fourth program/verify loops associated with the initial set of skipped program states (P(1), P(2)) are omitted in the first program pass of FIG. 7E (e.g., related program pulses Pulse 1 to Pulse 4, "Start P(1) Verify," and "Start P(2) Verify" are depicted using shaded areas in FIG. 7E). The first to fourth program/verify loops omitted in the first program pass are program/verify loops before the program state P(3), which is subsequent to the last skipped program state P(2), is started to be verified. For example, the omitted first to fourth program/verify loops are program/verify loops before the verify voltage Vvf_3 is applied to verify threshold voltages of memory cells having the target program state P(3).

In FIG. 7E, the initial program/verify loop of the first program pass is the fifth program/verify loop. An initial program voltage (Vpgm_skip_init=Pulse 5) is applied to a select word line to program the second subset of the memory cells corresponding to the program states P(3)-P(7), followed by a verify voltage Vvf_3 to start verifying memory cells with the target program state P(3). Similar operations can be performed in remaining program/verify loops of FIG. 7E, and the similar description will not be repeated herein.

Figure 8A:
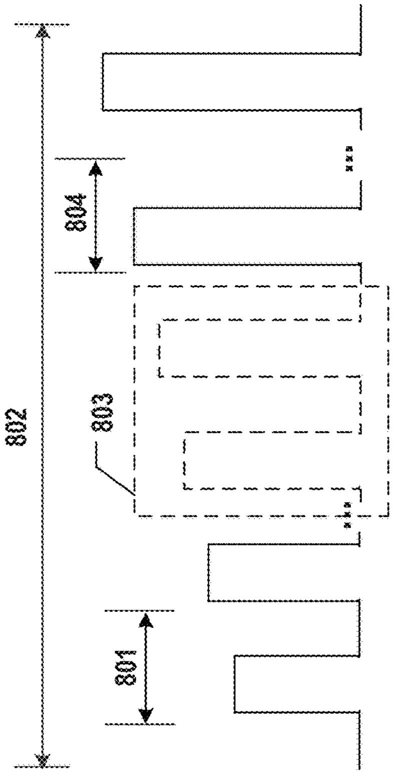
FIGS. 8A-8C illustrate a waveform of word line voltages applied to a select word line in a first program pass with a second set of skipped program states, according to some aspects of the present disclosure.
Figure 8B:
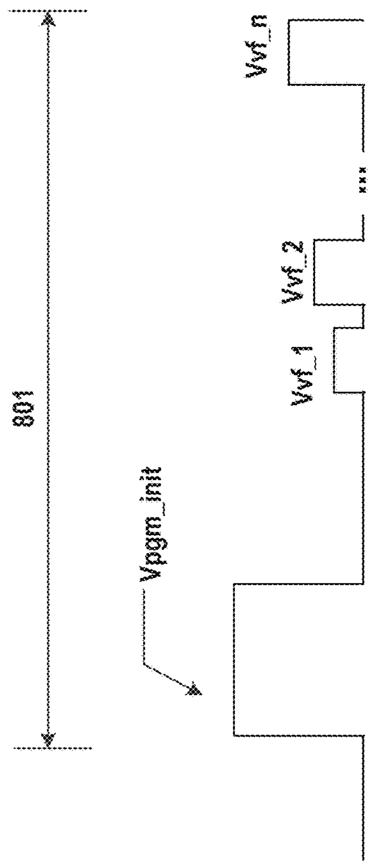
Figure 8C:
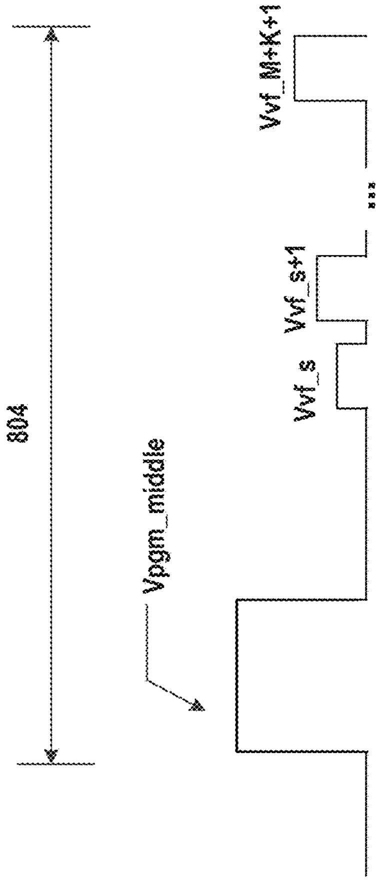

FIGS. 8A-8C illustrate a waveform of word line voltages applied to a select word line of a memory device in a first program pass 802 having a second set of skipped program states, according to some aspects of the present disclosure. The memory device may include memory cells and can be any non-volatile memory device disclosed herein (e.g., memory device 104, 302, or 400). In first program pass 802, the second set of skipped program states may include a middle set of program states from P(M) to P(M+K) with M>1 and $M+K<2^N-1$. A remaining set of program states may include a first remaining subset from P(1) to P(M−1) and a second remaining subset from P(M+K+1) to $P(2^N-1)$. A first subset of the memory cells may correspond to the middle set of skipped program states, whereas a second subset of the memory cells may correspond to the remaining set of program states. The peripheral circuit of the memory device may be configured to program the second subset of the memory cells and meanwhile inhibit the programming of the first subset of the memory cells during first program pass 802.

For example, an initial program/verify loop 801 of first program pass 802 is shown in FIGS. 8A-8B. In initial program/verify loop 801, an initial program voltage (Vpgm_init) is applied to the select word line, followed by a number of verify voltages (Vvf_1, Vvf_2, . . . , Vvf_n) with incremental changes of voltage levels (e.g., similar to that of FIG. 6B). The initial program voltage (Vpgm_init), as well as other program voltages in following program/verify loops, is used to program the second subset of the memory cells corresponding to the remaining set of program states.

Compared with FIG. 6A, a plurality of program/verify loops 803 associated with the middle set of skipped program states from P(M) to P(M+K) are depicted with dashed lines in a dashed box in FIG. 8A and are omitted in first program pass 802. In some implementations, the plurality of program/verify loops 803 omitted in first program pass 802 may include a part of the program/verify loops of FIG. 6A (a) when or after the program state P(M) is started to be verified in FIG. 6A and (b) before the program state P(M+K+1) is started to be verified. An example of the plurality of program/verify loops omitted in the first program pass is illustrated in FIG. 8D.

After omitting the plurality of program/verify loops 803, a subsequent program/verify loop 804 is used to continue programming the second subset of the memory cells corresponding to the remaining set of program states. The program state P(M+K+1) following the last skipped program state P(M+K) is started to be verified in program/verify loop 804. A program voltage (Vpgm_middle) is applied to the select word line, followed by a number of verify voltages (Vvf_s, Vvf_s+1, . . . , Vvf_M+K+1). The verify voltages (Vvf_s, Vvf_s+1, . . . , Vvf_M+K+1) may include (a) one or more verify voltages for the first remaining subset of program states and (b) the verify voltage for the program state P(M+K+1) in the second remaining subset of program states. The verify voltages (Vvf_s, Vvf_s+1, . . . , Vvf_M+K+1) may not include any verify voltage for the middle set of skipped program states.

After first program pass 802, a second program pass may be performed with a waveform of word line voltages applied to the select word line like that of FIGS. 7C-7D. The similar description will not be repeated here.

FIG. 8D illustrates another table (Table 3) listing program pulses, program states, and verify levels applied in a first program pass having a middle set of skipped program states, according to some aspects of the present disclosure. Table 3 can be used to program TLCs. It is contemplated that although FIG. 8D is described below with respect to TLCs, the similar description can also be applied to any other XLCs, such as QLCs, which is not limited herein. The middle set of skipped program states in FIG. 8D may include two continuous program states (P(3), P(4)).

Compared with FIG. 6E, the fifth to eighth program/verify loops associated with the middle set of program states (P(3), P(4)) are omitted in the first program pass of FIG. 8D (e.g., related program pulses Pulse 5 to Pulse 8, "Start P(3) Verify," and "Start P(4) Verify" are depicted using shaded areas in FIG. 8A). The fifth to eighth program/verify loops omitted in the first program pass are program/verify loops (a) when or after the skipped program state P(3) is started to be verified in FIG. 6E and (b) before the program state P(5) following the last skipped program state P(4) is started to be verified.

It is noted that in FIG. 8D, the first subset of the memory cells corresponding to the middle set of skipped program states P(3)-P(4) may not be programmed in the first program pass. For example, an initial program/verify loop of the first program pass is the first program/verify loop. In the first program/verify loop, an initial program voltage (Pulse 1) is applied to a select word line to program the second subset of the memory cells corresponding to the program states P(1)-P(2) and P(5)-P(7), followed by a verify voltage Vvf_1 to start verifying memory cells with the target program state P(1). In another example, in the ninth program/verify loop subsequent to the omitted eighth program/verify loop, a program voltage (Pulse 9) can be applied to program memory cells corresponding to the program states P(5)-P(7), followed by a verify voltage Vvf_5 to start verifying memory cells with the target program state P(5). In some implementations, only the verify voltage Vvf_5 corresponding to the program state P(5) is included in the ninth program/verify loop. In some other implementations, the verify voltage Vvf_2 corresponding to the program state P(2) (or, both the verify voltage Vvf_1 corresponding to the program state P(1) and the verify voltage Vvf_2 corresponding to the program state P(2)) can also be included in the ninth program/verify loop.

Figure 9B:
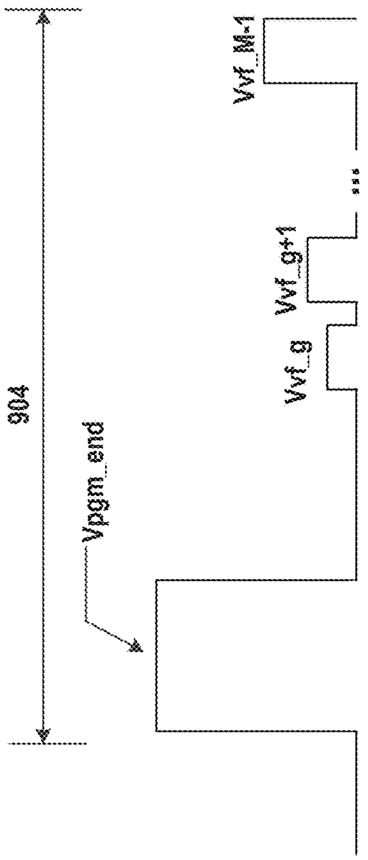
FIGS. 9A-9B illustrate a waveform of word line voltages applied to a select word line in a first program pass with a third set of skipped program states, according to some aspects of the present disclosure.
Figure 9D:
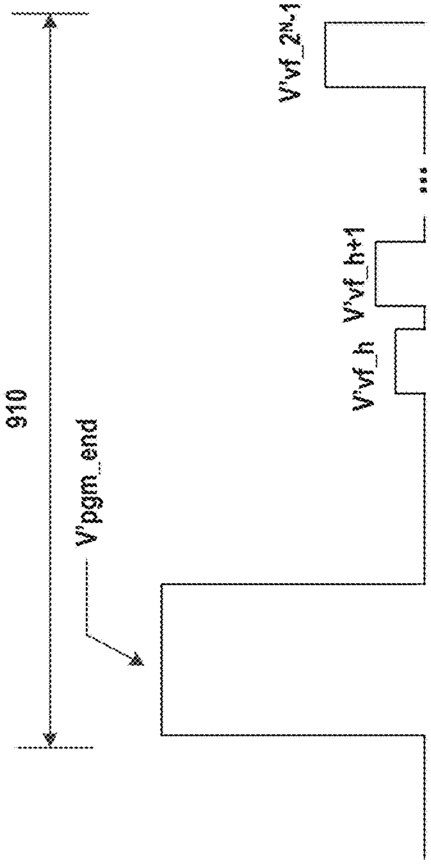
FIGS. 9C-9D illustrate a waveform of word line voltages applied to a select word line in a second program pass following the first program pass of FIGS. 9A-9B, according to some aspects of the present disclosure.
Figure 9A:
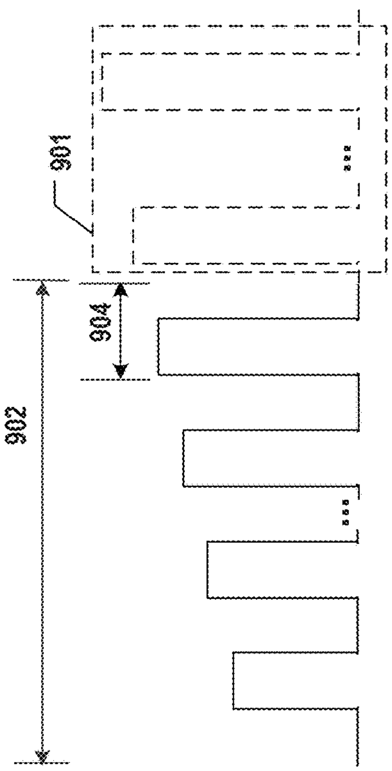

FIGS. 9A-9B illustrate a waveform of word line voltages applied to a select word line in a first program pass 902 having a third set of skipped program states, according to some aspects of the present disclosure. The memory device may include memory cells and can be any non-volatile memory device disclosed herein (e.g., memory device 104, 302, or 400). In first program pass 902, the third set of skipped program states may include an ending set of program states from P(M) to P($2^N$−1) with M>1 and M+K=$2^N$−1. A remaining set of program states may include P(1) to P(M−1). A first subset of the memory cells may correspond to the ending set of program states, whereas a second subset of the memory cells may correspond to the remaining set of program states. The peripheral circuit of the memory device may be configured to program the second subset of the memory cells and meanwhile inhibit the programming of the first subset of the memory cells during first program pass 902.

For example, with reference to FIG. 9A, an ending program/verify loop 904 (which is the last program/verify loop) of first program pass 902 is shown in FIGS. 9A-9B. In ending program/verify loop 904, an ending program voltage (Vpgm_end) is applied to the select word line, followed by a number of verify voltages (Vvf_g, Vvf_g+1, . . . , Vvf_M−1) with incremental changes of voltage levels, where g is a positive integer (1≤g≤M−1). Vvf_g may indicate a verify voltage for the program state P(g). Vvf_g+1 may indicate a verify voltage for the program state P(g+1). Vvf_M−1 may indicate a verify voltage for the program state P(M−1). The ending program voltage (Vpgm_end) is used to program remaining memory cells in the second subset of the memory cells, which have respective target program states P(g), P(g+1), . . . , P(M−1) and have not passed their respective verify voltages yet.

Compared with FIG. 6A, a plurality of program/verify loops 901 associated with the ending set of program states from P(M) to P($2^N$−1) are depicted with dashed lines in a dashed box in FIG. 9A and are omitted in first program pass 902. In some implementations, the plurality of program/verify loops 901 omitted in first program pass 902 may include one or more last program/verify loops of FIG. 6A. An example of the plurality of program/verify loops omitted in the first program pass is illustrated in FIG. 9E.

Figure 9C:
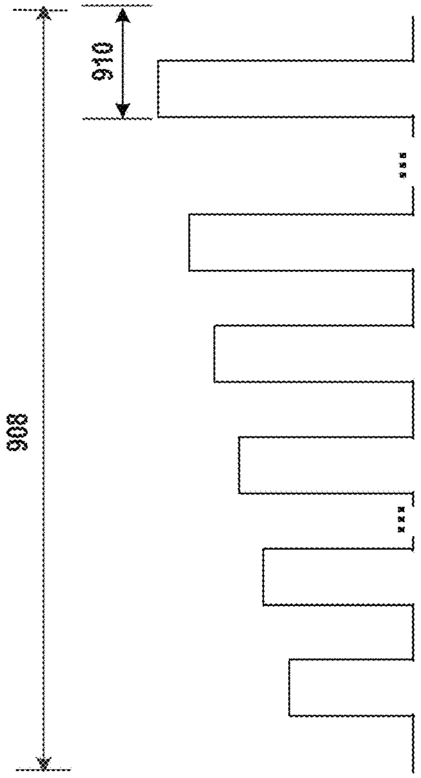

FIGS. 9C-9D illustrate a waveform of word line voltages applied to a select word line in a second program pass 908 following first program pass 902 of FIGS. 9A-9B, according to some aspects of the present disclosure. Second program pass 908 may be like second program pass 708 of FIGS. 7C-7D, and the similar description will not be repeated herein.

An ending program/verify loop 910 of second program pass 908 is shown in FIGS. 9C-9D. In ending program/verify loop 910, an ending program voltage (V'pgm_end) is applied to the select word line, followed by verify voltages (V'vf_h, V'vf_h+1, . . . , V'vf_2N−1) with incremental changes of voltage levels, where h is a positive integer and h≤$2^N$−1. The ending program voltage (Vpgm_end) applied to the select word line to program the second subset of the memory cells in first program pass 902 is smaller than the ending program voltage (V'pgm_end) applied to the select word line to program the memory cells in second program pass 908 (e.g., Vpgm_end<V'pgm_end).

FIG. 9E illustrates a table (Table 4) listing program pulses, program states, and verify levels applied in a first program pass having a third set of skipped program states, according to some aspects of the present disclosure. Table 4 can be used to program TLCs. It is contemplated that although FIG. 9E is described below with respect to TLCs, the similar description can also be applied to any other XLCs, such as QLCs, which is not limited herein. The ending set of skipped program states in FIG. 9E may include two continuous program states (P(6), P(7)).

Compared with FIG. 6E, one or more last program/verify loops in FIG. 6E can be omitted in the first program pass of FIG. 9E. For example, the fourteenth to seventeenth program/verify loops are omitted in the first program pass of FIG. 9E (e.g., related program pulses Pulse 13 to Pulse 14, "Start P(6) Verify," and "Start P(7) Verify" are depicted using shaded areas in FIG. 9E).

Figure 10:
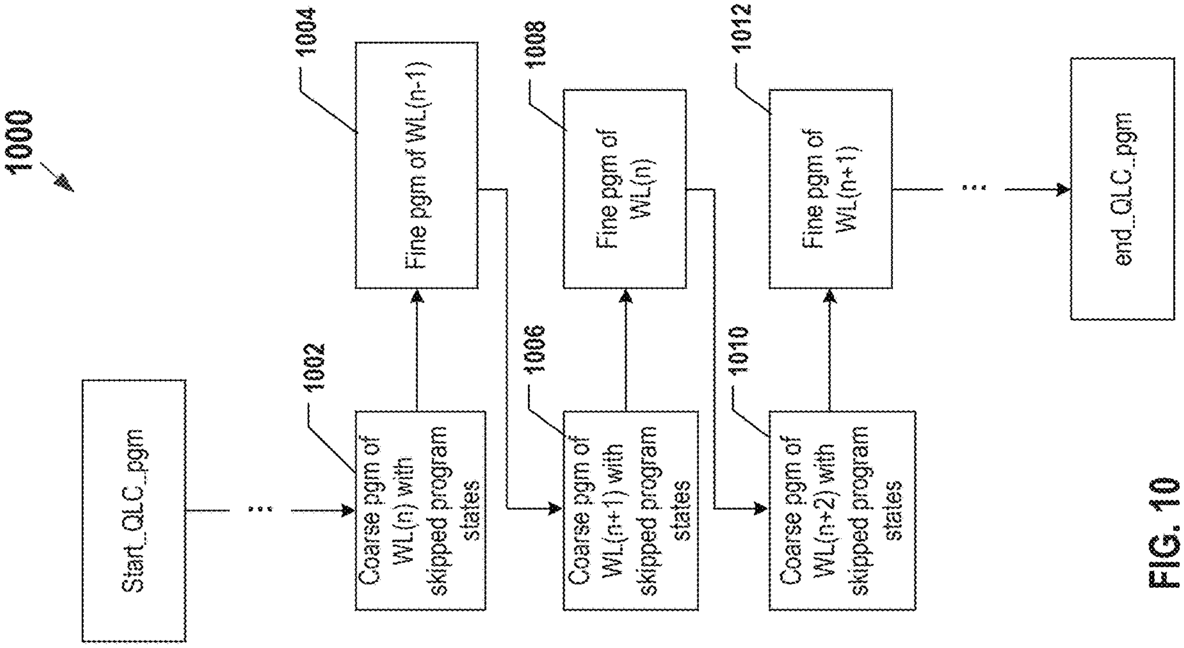
FIG. 10 illustrates a process for performing multi-pass program operations in a memory device, according to some aspects of the present disclosure.

FIG. 10 illustrates a process 1000 for performing multi-pass program operations in a memory device, according to some aspects of the present disclosure. Process 1000 may be executed by peripheral circuits of the memory device (e.g., peripheral circuits 402 of FIG. 4). The multi-pass program operations may be performed with respect to a plurality of word lines (e.g., WL(n−1), WL(n), WL(n+1)), respectively. Similar to FIG. 6F, a coarse program pass and a fine program pass may be performed with respect to each word line. For example, a coarse program pass 1002 associated with the word line WL(n) can be performed. Before coarse program pass 1002, a coarse program pass associated with the word line WL(n−1) (not shown in FIG. 10) can be performed.

Following coarse program pass 1002, a fine program pass 1004 associated with the word line WL(n−1) can be performed. Subsequently, a coarse program pass 1006 associated with the word line WL(n+1), a fine program pass 1008 associated with the word line WL(n), a coarse program pass 1010 associated with the word line WL(n+2), and a fine program pass 1012 associated with the word line WL(n+1), and so on and so forth, can be performed sequentially.

Consistent with some aspects of the present disclosure, the program scheme disclosed herein can be implemented in each coarse program pass 1002, 1006, and 1010 to skip the programming of some program states. For example, a first subset of memory cells of the memory device corresponding to the skipped program states may be inhibited from being programmed in each coarse program pass 1002, 1006, and 1010 by performing operations like those described above with reference to FIGS. 7A-9E. The similar description will not be repeated herein.

Figure 11A:
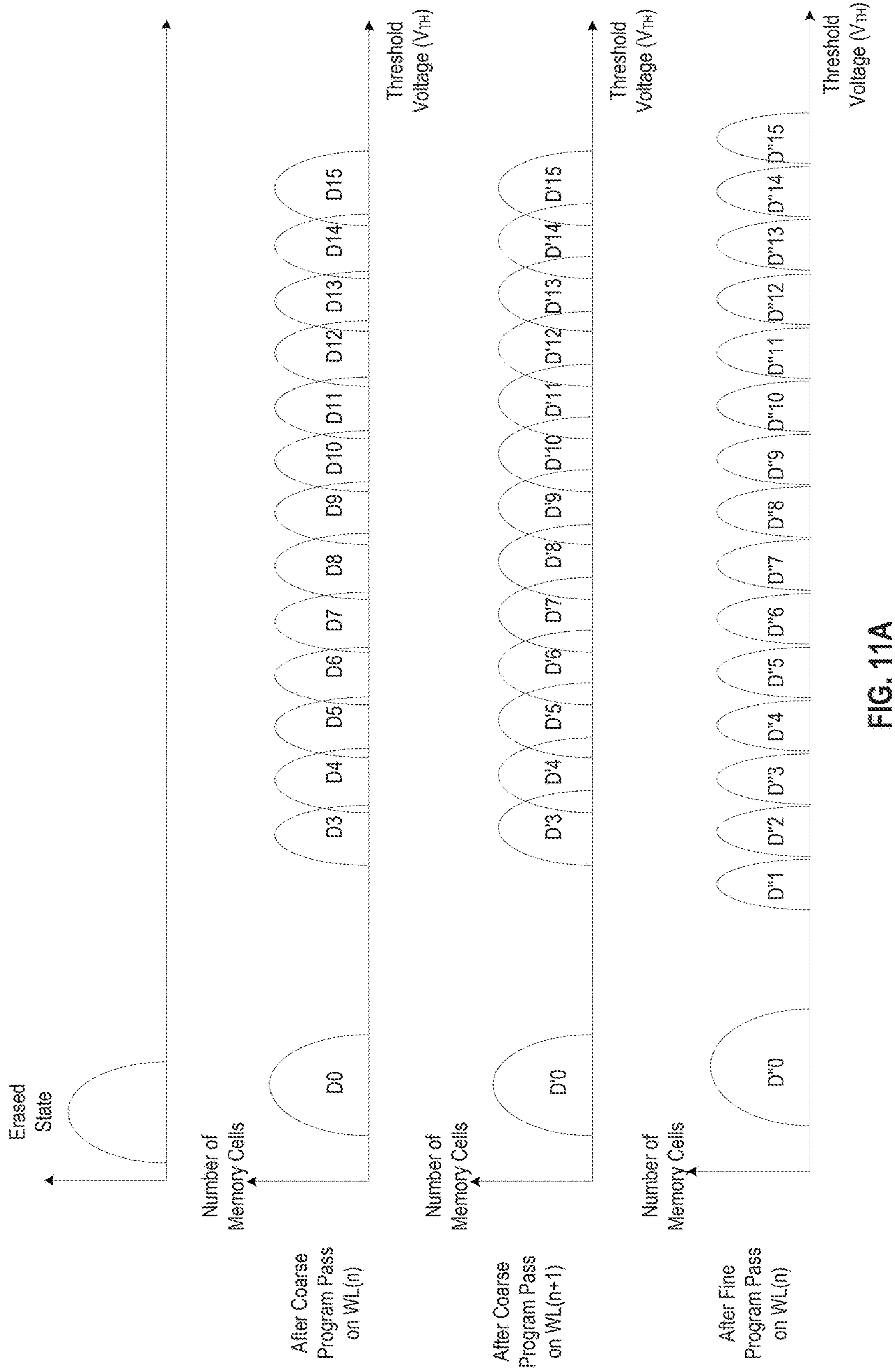
FIG. 11A illustrates threshold voltage distributions of memory cells in a multi-pass program operation with a first set of skipped program states, according to some aspects of the present disclosure.

FIG. 11A illustrates threshold voltage distributions of memory cells in a multi-pass program operation with a first set of skipped program states in a memory device, according to some aspects of the present disclosure. The memory device may include memory cells and can be any memory device disclosed herein. For example, the memory device may include QLCs, the first set of skipped program states may include program states P(1) and P(2), and a remaining set of program states may include program states P(3)-P(15). In a first program pass (e.g., coarse program pass), a first subset of the memory cells corresponding to the skipped program states P(1) and P(2) are not programmed, and only a second subset of the memory cells corresponding to the remaining set of program states are programmed into 13 intermediate levels. For example, after the coarse program pass on the word line WL(n) is performed, a curve DO may represent a threshold voltage distribution of the erased state (P0), and curves D3, . . . , D15 may represent threshold voltage distributions of the program states P(3), . . . , P(15), respectively. There are no threshold voltage distributions for the skipped program states P(1) and P(2). Afterwards, the coarse program pass on the word line WL(n+1) is performed. Then, curves D3, . . . , D15 may become wider due to the coupling effect between the word lines WL(n) and WL(n+1). That is, curves D3, . . . , D15 may be changed to curves D'3, . . . , D'15, which represent respective threshold voltage distributions of the program states P(3), . . . , P(15) after the coarse program pass on the word line WL(n+1) is performed.

In the second program pass (e.g., fine program pass), both the first and second subsets of the memory cells are programmed. D"0, D"1, D"2, . . . , D"15 may represent respective threshold voltage distributions of the erased state P0 and the program states P(1), P(2), . . . , P(15) after the fine program pass on the word line WL(n) is performed.

Figure 11B:
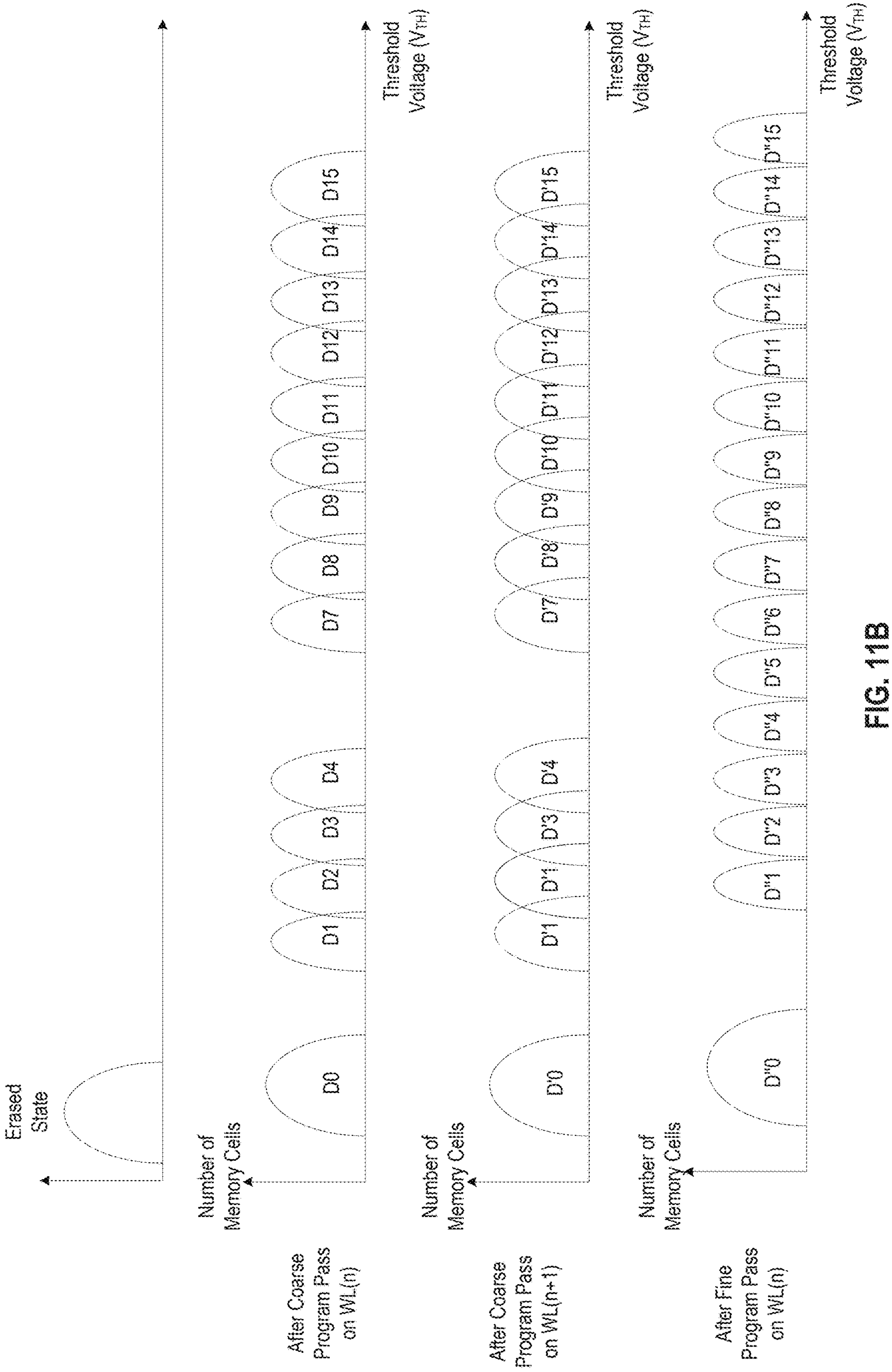
FIG. 11B illustrates threshold voltage distributions of memory cells in a multi-pass program operation with a second set of skipped program states, according to some aspects of the present disclosure.

FIG. 11B illustrates threshold voltage distributions of memory cells in a multi-pass program operation with a second set of skipped program states in a memory device, according to some aspects of the present disclosure. For example, the memory device may include QLCs, the second set of skipped program states can be P(5) and P(6), and a remaining set of program states may include program states P(1)-P(4) and P(7)-P(15). In a first program pass (e.g., coarse program pass), a first subset of the memory cells corresponding to the skipped program states P(5) and P(6) are not programmed, and only a second subset of the memory cells corresponding to the remaining set of program states are programmed into 13 intermediate levels. For example, after the coarse program pass on the word line WL(n) is performed, a curve D0 may represent a threshold voltage distribution of the erased state (P0), and curves D1-D4 and D7-D15 may represent threshold voltage distributions of the program states P(1)-P(4) and P(7)-P(15), respectively. There are no threshold voltage distributions for the skipped program states P(5) and P(6). Afterwards, the coarse program pass on the word line WL(n+1) is performed. Then, curves D1-D4 and D7-D15 may become wider due to the coupling effect between the word lines WL(n) and WL(n+1). That is, curves D1-D4 and D7-D15 may be changed to curves D'1-D'4 and D'7-D'15, which represent respective threshold voltage distributions of the program states P(1)-P(4) and P(7)-P(15) after the coarse program pass on the word line WL(n+1) is performed.

In the second program pass (e.g., fine program pass), both the first and second subsets of the memory cells are programmed. D"0, D"1, D"2, . . . , D" 15 may represent respective threshold voltage distributions of the erased state P0 and the program states P(1), P(2), . . . , P(15) after the fine program pass on the word line WL(n) is performed.

Figure 11C:
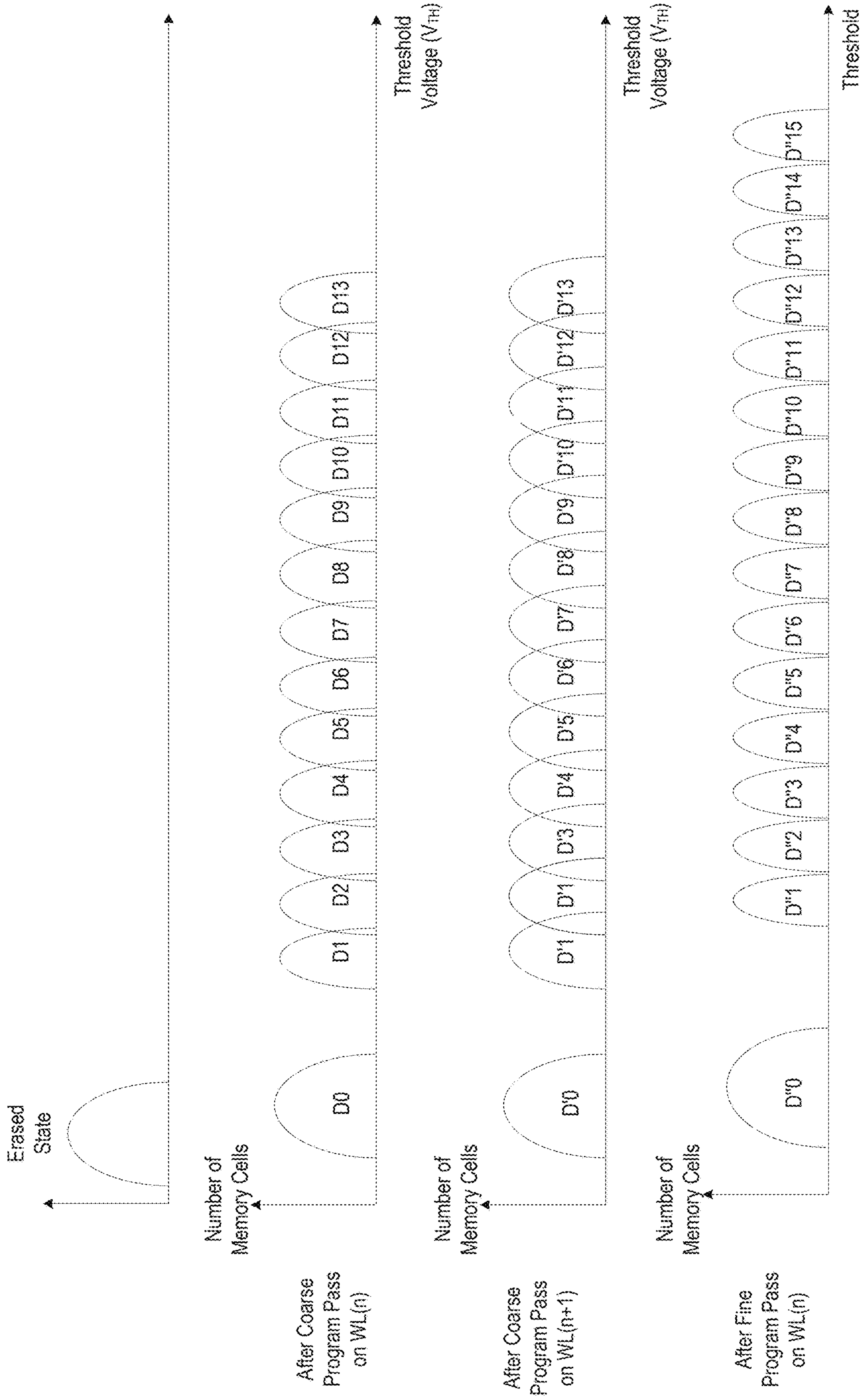
FIG. 11C illustrates threshold voltage distributions of memory cells in a multi-pass program operation with a third set of skipped program states, according to some aspects of the present disclosure.

FIG. 11C illustrates threshold voltage distributions of memory cells in a multi-pass program operation with a third set of skipped program states, according to some aspects of the present disclosure. For example, the memory device may include TLCs, the second set of skipped program states can be P(14) and P(15), and a remaining set of program states may include program states P(1)-P(13). In a first program pass (e.g., coarse program pass), a first subset of the memory cells corresponding to the skipped program states P(14) and P(15) are not programmed, and only a second subset of the memory cells corresponding to the remaining set of program states are programmed into 13 intermediate levels. For example, after the coarse program pass on the word line WL(n) is performed, a curve DO may represent a threshold voltage distribution of the erased state, and curves D1-D13 may represent threshold voltage distributions of the program states P(1)-P(13), respectively. There are no threshold voltage distributions for the skipped program states P(14) and P(15). Afterwards, the coarse program pass on the word line WL(n+1) is performed. Then, curves D1-D13 may become wider due to the coupling effect between the word lines WL(n) and WL(n+1). That is, curves D1-D13 may be changed to curves D'1-D'13, which represent respective threshold voltage distributions of the program states P(1)-P(13) after the coarse program pass on the word line WL(n+1) is performed.

In the second program pass (e.g., fine program pass), both the first and second subsets of the memory cells are programmed. D"0, D"1, D"2, . . . , D"15 may represent respective threshold voltage distributions of the erased state P(0), and the program states P(1)-P(15) after the fine program pass on the word line WL(n) is performed.

Figure 12:
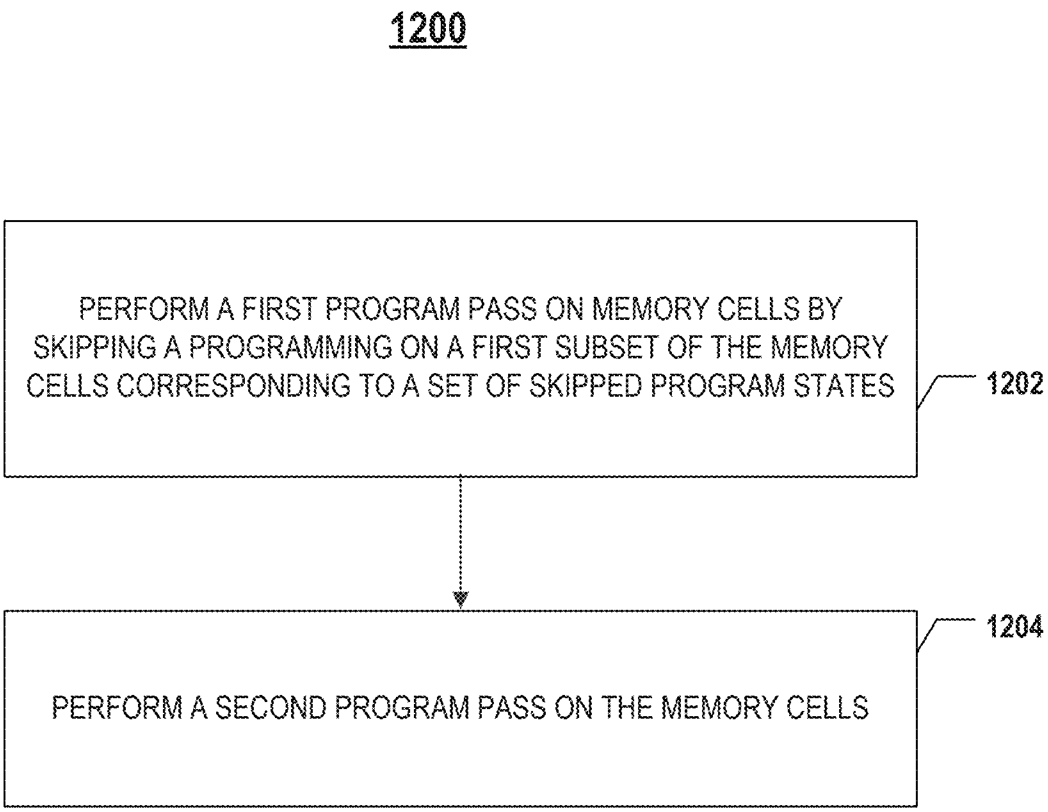
FIG. 12 illustrates a flowchart of a method for operating a memory device, according to some aspects of the present disclosure.

FIG. 12 illustrates a flowchart of a method 1200 for operating a memory device, according to some aspects of the present disclosure. The memory device may be any suitable memory device disclosed herein, such as memory device 104, 302, or 400. Method 1200 may be implemented by peripheral circuits 402, such as control logic 512 and row decoder/word line driver 508. It is understood that the operations shown in method 1200 may not be exhaustive and that other operations can be performed as well before, after, or between any of the illustrated operations. Further, some of the operations may be performed simultaneously, or in a different order than shown in FIG. 12.

Referring to FIG. 12, method 1200 starts at operation 1202, in which a first program pass is performed on memory cells of the memory device by skipping a programming on a first subset of the memory cells corresponding to a set of skipped program states. For example, in the first program pass, a second subset of the memory cells corresponding to a remaining set of program states can be programmed, whereas the first subset of the memory cells corresponding to the set of skipped program states can be inhibited from being programmed.

Method 1200 proceeds to operation 1204, as illustrated in FIG. 12, in which a second program pass is performed on the memory cells of the memory device. For example, both the first and second subsets of the memory cells can be programmed in the second program pass.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method of operating a memory device comprising memory cells, the memory cells associated with an erased state and a plurality of program states, the method comprising:

performing a first program pass on the memory cells by skipping a programming on a first subset of the memory cells corresponding to a set of skipped program states, wherein a target program state of each memory cell in the first subset is one of the set of skipped program states, wherein the plurality of program states comprise the set of skipped program states and a remaining set of program states, and wherein only a second subset of the memory cells corresponding to the remaining set of program states are programmed in the first program pass and into a plurality of intermediate states; and performing a second program pass on the memory cells, comprising:

programming, in the second program pass, the first subset of the memory cells and the second subset of the memory cells corresponding to the remaining set of program states.

2. The method of claim 1, wherein skipping the programming on the first subset of the memory cells comprises:

applying an inhibit voltage to a set of bit lines corresponding to the first subset of the memory cells to inhibit the programming on the first subset of the memory cells in the first program pass.

3. The method of claim 1, wherein:

the set of skipped program states comprises two or more continuous program states.

4. The method of claim 3, wherein performing the first program pass on the memory cells further comprises:

programming, in the first program pass, the second subset of the memory cells corresponding to the remaining set of program states from the plurality of program states.

5. The method of claim 3, wherein:

the plurality of program states are denoted as P(1), P(2), . . . , and P($2^N$-1), wherein N is an integer representing a number of bits stored per memory cell with N≥2; and the two or more continuous program states comprise a set of program states from P(M) to P(M+K), wherein M and K are integers with M≥1 and K≥1.

6. The method of claim 5, wherein:

the set of program states from P(M) to P(M+K) comprises an initial set of program states from P(1) to P(1+K) with M=1; and performing the first program pass on the memory cells comprises:

programming, in the first program pass, the second subset of the memory cells corresponding to the remaining set of program states from P(2+K) to P($2^N$−1), wherein the first subset of the memory cells corresponding to the initial set of program states from P(1) to P(1+K) is inhibited from being programmed in the first program pass.

7. The method of claim 6, wherein an initial program voltage applied to a word line to program the second subset of the memory cells in the first program pass is greater than an initial program voltage applied to the word line to program the memory cells in the second program pass.

8. The method of claim 5, wherein:

the set of program states from P(M) to P(M+K) comprises a middle set of program states from P(M) to P(M+K) with M>1 and M+K<$2^N$−1; and performing the first program pass on the memory cells comprises:

programming, in the first program pass, the second subset of the memory cells corresponding to the remaining set of program states including a first remaining subset from P(1) to P(M-1) and a second remaining subset from P(M+K+1) to P($2^N$-1), wherein the first subset of the memory cells corresponding to the middle set of program states from P(M) to P(M+K) is inhibited from being programmed in the first program pass.

9. The method of claim 5, wherein:

the set of program states from P(M) to P(M+K) comprises an ending set of program states from P(M) to P($2^N$−1) with M>1 and M+K=$2^N$−1; and performing the first program pass on the memory cells comprises:

programming, in the first program pass, the second subset of the memory cells corresponding to the remaining set of program states from P(1) to P(M−1), wherein the first subset of the memory cells corresponding to the ending set of program states from P(M) to P($2^N$−1) is inhibited from being programmed in the first program pass.

10. The method of claim 9, wherein an ending program voltage applied to a word line to program the second subset of the memory cells in the first program pass is smaller than an ending program voltage applied to the word line to program the memory cells in the second program pass.

11. A memory device, comprising:

memory cells associated with an erased state and a plurality of program states; and a peripheral circuit coupled to the memory cells and configured to:

perform a first program pass on the memory cells by skipping a programming on a first subset of the memory cells corresponding to a set of skipped program states, wherein a target program state of each memory cell in the first subset is one of the set of skipped program states, wherein the plurality of program states comprise the set of skipped program states and a remaining set of program states, and wherein only a second subset of the memory cells corresponding to the remaining set of program states are programmed in the first program pass and into a plurality of intermediate states; and perform a second program pass on the memory cells, comprising:

programming, in the second program pass, the first subset of the memory cells and the second subset of the memory cells corresponding to the remaining set of program states.

12. The memory device of claim 11, wherein to perform the first program pass on the memory cells by skipping the programming on the first subset of the memory cells, the peripheral circuit is configured to:

apply an inhibit voltage to a set of bit lines corresponding to the first subset of the memory cells to inhibit the programming on the first subset of the memory cells in the first program pass.

13. The memory device of claim 11, wherein:

the set of skipped program states comprises two or more continuous program states.

14. The memory device of claim 13, wherein to perform the first program pass on the memory cells, the peripheral circuit is further configured to:

program, in the first program pass, the second subset of the memory cells corresponding to the remaining set of program states from the plurality of program states.

15. The memory device of claim 13, wherein:

the plurality of program states are denoted as P(1), P(2), . . . , and P($2^N$−1), wherein N is an integer representing a number of bits stored per memory cell with N≥2; and the two or more continuous program states comprise a set of program states from P (M) to P(M+K), wherein M and K are integers with M≥1 and K≥1.

16. The memory device of claim 15, wherein:

the set of program states from P(M) to P(M+K) comprises an initial set of program states from P(1) to P(1+K) with M=1; and to perform the first program pass on the memory cells, the peripheral circuit is further configured to:

program, in the first program pass, the second subset of the memory cells corresponding to the remaining set of program states from P(2+K) to P($2^N$−1), wherein the first subset of the memory cells corresponding to the initial set of program states from P(1) to P(1+K) is inhibited from being programmed in the first program pass.

17. The memory device of claim 16, wherein an initial program voltage applied to a word line to program the second subset of the memory cells in the first program pass is greater than an initial program voltage applied to the word line to program the memory cells in the second program pass.

18. The memory device of claim 15, wherein:

the set of program states from P(M) to P(M+K) comprises a middle set of program states from P(M) to P(M+K) with M>1 and M+K<$2^N$−1; and during performing the first program pass on the memory cells, the peripheral circuit is further configured to:

program, in the first program pass, the second subset of the memory cells corresponding to the remaining set of program states including a first remaining subset from P(1) to P(M−1) and a second remaining subset from P(M+K+1) to P($2^N$−1), wherein the first subset of the memory cells corresponding to the middle set of program states from P(M) to P(M+K) is inhibited from being programmed in the first program pass.

19. The memory device of claim 15, wherein:

the set of program states from P(M) to P(M+K) comprises an ending set of program states from P(M) to P($2^N$−1) with M>1 and M+K=$2^N$−1; and during performing the first program pass on the memory cells, the peripheral circuit is further configured to:

program, in the first program pass, the second subset of the memory cells corresponding to the remaining set of program states from P(1) to P(M−1), wherein the first subset of the memory cells corresponding to the ending set of program states from P(M) to P($2^N$−1) is inhibited from being programmed in the first program pass.

20. A system, comprising:

a memory device configured to store data and comprising:

memory cells associated with an erased state and a plurality of program states; and a peripheral circuit coupled to the memory cells and configured to:

perform a first program pass on the memory cells by skipping a programming on a first subset of the memory cells corresponding to a set of skipped program states, wherein a target program state of each memory cell in the first subset is one of the set of skipped program states, wherein the plurality of program states comprise the set of skipped program states and a remaining set of program states, and wherein only a second subset of the memory cells corresponding to the remaining set of program states are programmed in the first program pass and into a plurality of intermediate states; and perform a second program pass on the memory cells, comprising:

programming, in the second program pass, the first subset of the memory cells and the second subset of the memory cells corresponding to the remaining set of program states; and a memory controller coupled to the memory device and configured to control an operation of the memory device.

* * * * *